(12) United States Patent
Park et al.

(10) Patent No.: US 10,504,960 B2
(45) Date of Patent: Dec. 10, 2019

(54) SEMICONDUCTOR MEMORY DEVICES

(71) Applicant: Samsung Electronics Co., Ltd., Suwon-si, Gyeonggi-do (KR)

(72) Inventors: Kichul Park, Hwaseong-si (KR); Ki-Woong Kim, Songbuk-gu (KR); Hansol Seok, Suwon-si (KR); Byoungho Kwon, Hwaseong-si (KR); Boun Yoon, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 15/919,639

(22) Filed: Mar. 13, 2018

(65) Prior Publication Data

US 2019/0081102 A1    Mar. 14, 2019

(30) Foreign Application Priority Data

Sep. 12, 2017 (KR) .................. 10-2017-0116776

(51) Int. Cl.
*H01L 27/22* (2006.01)
*H01L 43/08* (2006.01)
(Continued)

(52) U.S. Cl.
CPC .......... *H01L 27/228* (2013.01); *G11C 11/161* (2013.01); *H01F 10/3254* (2013.01);
(Continued)

(58) Field of Classification Search
CPC .................................................. G11C 11/161
See application file for complete search history.

(56) References Cited

U.S. PATENT DOCUMENTS 6,462,428 B2   10/2002   Iwamatsu
8,241,988 B2   8/2012    Kwon et al.
(Continued)

FOREIGN PATENT DOCUMENTS

KR   1998-0054457 U    10/1998
KR   10-0816248 B1     3/2008
(Continued)

*Primary Examiner* — Charles D Garber
*Assistant Examiner* — Alia Sabur
(74) *Attorney, Agent, or Firm* — Harness, Dickey and Pierce, P.L.C.

(57) ABSTRACT

A semiconductor memory device may include a selection transistor on a semiconductor substrate, an interlayered insulating layer covering the selection transistor, a lower contact plug coupled to a drain region of the selection transistor and configured to penetrate the interlayered insulating layer, and a magnetic tunnel junction pattern coupled to the lower contact plug. The lower contact plug may include a metal pattern and a capping metal pattern in contact with a top surface of the metal pattern. The capping metal pattern may include a top surface having a surface roughness that is smaller than a surface roughness of the top surface of the metal pattern. The magnetic tunnel junction pattern may include bottom and top electrodes, a lower magnetic layer and an upper magnetic layer between the top and bottom electrodes, and a tunnel barrier layer between the lower magnetic layer and the upper magnetic layer.

19 Claims, 18 Drawing Sheets

(51) Int. Cl.
*H01L 43/02* (2006.01)
*H01F 10/32* (2006.01)
*H01L 23/532* (2006.01)
*H01L 23/528* (2006.01)
*G11C 11/16* (2006.01)
*H01L 43/12* (2006.01)
*H01L 21/768* (2006.01)
*H01L 21/027* (2006.01)
*H01L 21/3213* (2006.01)
*H01L 23/522* (2006.01)
*H01L 21/321* (2006.01)

(52) U.S. Cl.
CPC ..... *H01F 10/3286* (2013.01); *H01L 21/0274* (2013.01); *H01L 21/32136* (2013.01); *H01L 21/7685* (2013.01); *H01L 21/76802* (2013.01); *H01L 21/76843* (2013.01); *H01L 21/76877* (2013.01); *H01L 23/528* (2013.01); *H01L 23/5226* (2013.01); *H01L 23/53266* (2013.01); *H01L 43/02* (2013.01); *H01L 43/08* (2013.01); *H01L 43/12* (2013.01); *H01F 10/3272* (2013.01); *H01L 21/3212* (2013.01); *H01L 21/7684* (2013.01)

(56) References Cited

U.S. PATENT DOCUMENTS

| | | | |
|---|---|---|---|
| 8,324,743 | B2 | 12/2012 | Yeh et al. |
| 2007/0032015 | A1* | 2/2007 | Itoh ............ H01L 23/544 438/250 |
| 2008/0303074 | A1* | 12/2008 | Noda ........... H01L 21/76895 257/295 |
| 2014/0042508 | A1* | 2/2014 | Lee ............. H01L 27/228 257/295 |

FOREIGN PATENT DOCUMENTS

| | | |
|---|---|---|
| KR | 20090042469 A | 4/2009 |
| KR | 2010-0078947 A | 7/2010 |

* cited by examiner

SEMICONDUCTOR MEMORY DEVICES

CROSS-REFERENCE TO RELATED APPLICATIONS

This U.S. non-provisional patent application claims priority under 35 U.S.C. § 119 to Korean Patent Application No. 10-2017-0116776, filed on Sep. 12, 2017, in the Korean Intellectual Property Office, the entire contents of which are hereby incorporated by reference.

BACKGROUND

The present disclosure relates to semiconductor memory devices, and in particular, to semiconductor memory devices including magnetic tunnel junctions.

With increasing use of portable computing devices and wireless communication devices, memory devices to be included in said portable computing devices and wireless communication devices may require higher density, lower power, and/or nonvolatile properties. Magnetic memory devices may be able to satisfy the aforementioned technical requirements.

An example data storing mechanism for a magnetic memory device is a tunnel magneto resistance (TMR) effect of a magnetic tunnel junction (MTJ). For example, magnetic memory devices with MTJs have been developed to include one or more MTJs having a TMR ratio of several hundred percent to several thousand percent.

SUMMARY

Some example embodiments of the inventive concepts include a semiconductor memory device having improved electric characteristics.

According to some example embodiments of the inventive concepts, a semiconductor memory device may include a selection transistor on a semiconductor substrate, an interlayered insulating layer covering the selection transistor, a lower contact plug coupled to a drain region of the selection transistor and configured to penetrate the interlayered insulating layer, and a magnetic tunnel junction pattern coupled to the lower contact plug. The lower contact plug may include a metal pattern and a capping metal pattern in contact with a top surface of the metal pattern, the top surface of the metal pattern having a first surface roughness, the capping metal pattern including a top surface, the top surface of the capping metal pattern having a second surface roughness, the second surface roughness smaller than the first surface roughness. The magnetic tunnel junction pattern may include a bottom electrode, a top electrode, a lower magnetic layer and an upper magnetic layer between the top electrode and the bottom electrode, and a tunnel barrier layer between the lower magnetic layer and the upper magnetic layer.

According to some example embodiments of the inventive concepts, a semiconductor memory device may include a lower contact plug on a semiconductor substrate. The lower contact plug may penetrate an interlayered insulating layer. The lower contact plug may include a metal pattern penetrating a lower portion of the interlayered insulating layer, the metal pattern including a first metallic material, the metal pattern having a downwardly curved top surface, and a capping metal pattern in direct contact with the metal pattern and penetrating an upper portion of the interlayered insulating layer. The semiconductor memory device may include a magnetic tunnel junction pattern including a sequential stack of a bottom electrode, a lower magnetic layer, a tunnel barrier layer, an upper magnetic layer, and a top electrode on the semiconductor substrate, the bottom electrode in direct contact with a top surface of the capping metal pattern of the lower contact plug, the capping metal pattern including a second metallic material, the second metallic material different from the first metallic material, the capping metal pattern having a flat top surface.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Hereinafter, a semiconductor memory device and a method of fabricating the same, according to some example embodiments of the inventive concepts will be described in more detail with reference to the accompanying drawings.

Figure 1:
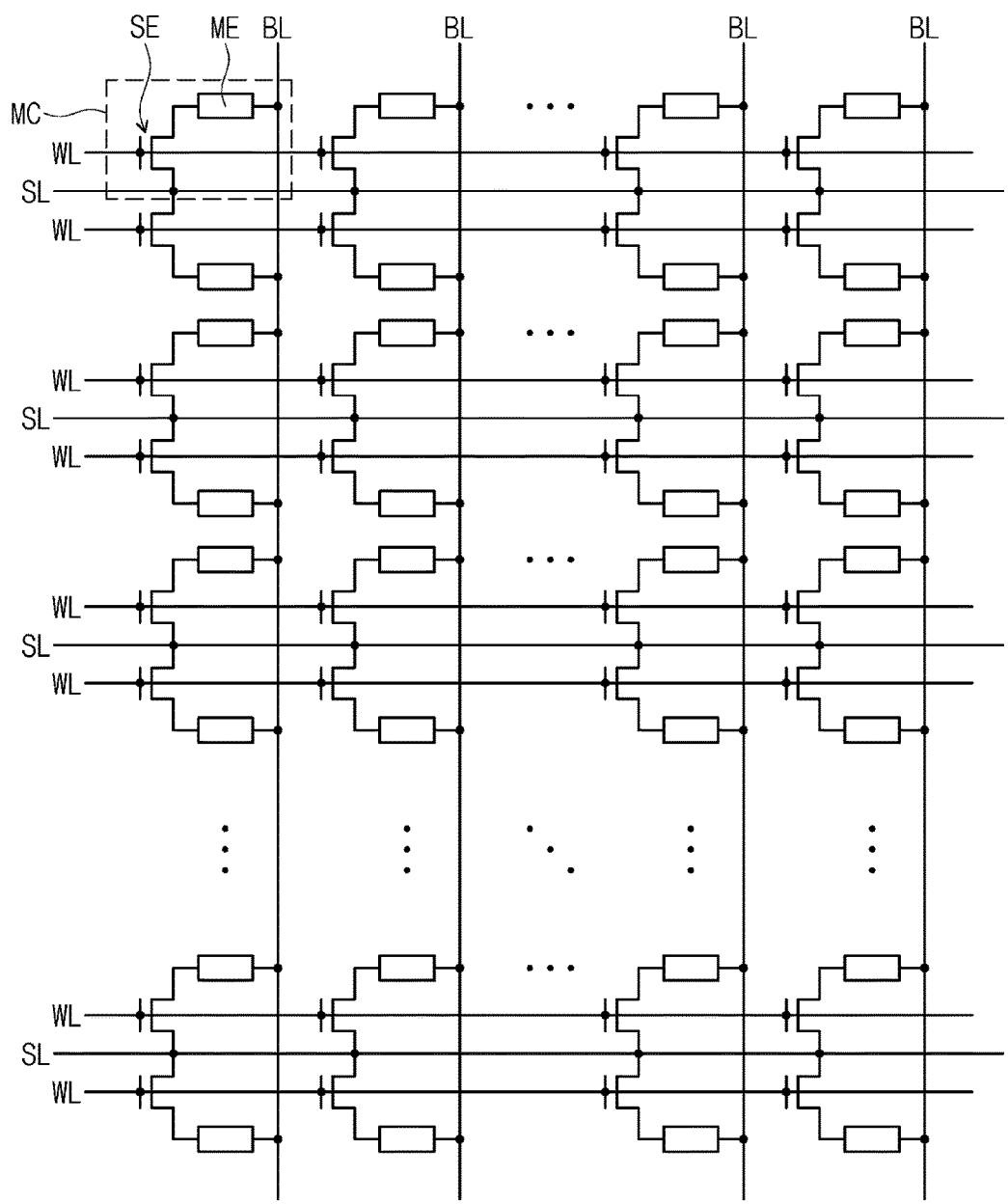
FIG. 1 is a circuit diagram illustrating a memory cell array of a semiconductor memory device according to some example embodiments of the inventive concepts.

FIG. 1 is a circuit diagram illustrating a cell array of a semiconductor memory device according to some example embodiments of the inventive concepts.

Referring to FIG. 1, a plurality of unit memory cells MC may be two- or three-dimensionally arranged ("configured") to form ("at least partially comprise") a memory cell array. Each of the unit memory cells MC may be provided between a word line WL and a bit line BL that are provided ("configured") to cross each other. Each of the unit memory cells MC may include a memory element ME and a selection element SE. The selection element SE and the memory element ME may be electrically coupled in series to each other.

The memory element ME may be coupled between the bit line BL and the selection element SE, and the selection element SE may be coupled between the memory element ME and a source line SL and may be controlled by the word line WL. The memory element ME may be a variable resistance device, whose resistance can be switched to one of at least two values by an electric pulse applied thereto. For example, the memory element ME may be formed to have a layered structure, whose electric resistance can be changed by a spin transfer process of an electric current passing therethrough. In some example embodiments, the memory element ME may have a layered structure configured to exhibit a magneto-resistance property and may include at least one ferromagnetic material and/or at least one antiferromagnetic material.

The selection element SE may be configured to control a flow of an electric current to be supplied to the memory element ME, depending on ("based on") a voltage applied to the word line WL. For example, the selection element SE may be one of a diode, a pnp bipolar transistor, an npn bipolar transistor, an n-channel metal oxide semiconductor field effect transistor (NMOS-FET), and a PMOS-FET. In the case where the selection element SE is a three-terminal device (e.g., a bipolar transistor or an MOS FET), the memory cell array may further include the source line SL, which may be coupled to a source electrode of the transistor. In addition, the source line SL may be provided between an adjacent pair of the word lines WL and may be shared in common by a plurality of transistors, which are coupled to the word lines WL.

Figure 2:
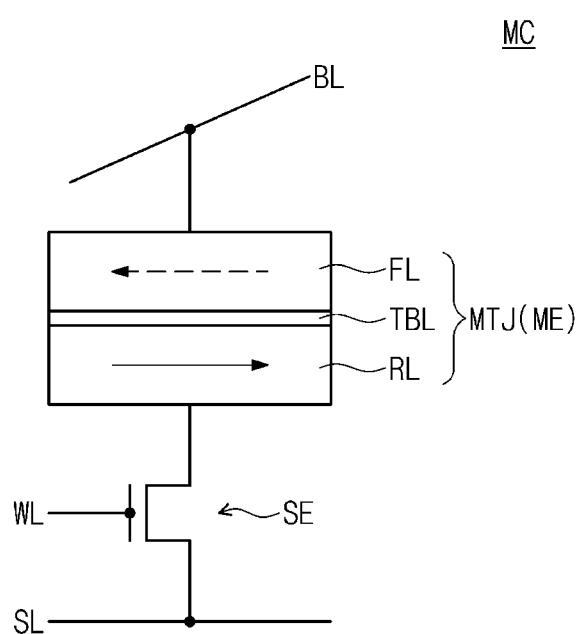
FIG. 2 is a schematic diagram illustrating a unit memory cell of a semiconductor memory device according to some example embodiments of the inventive concepts.

FIG. 2 is a schematic diagram illustrating a unit memory cell of a semiconductor memory device according to some example embodiments of the inventive concepts.

Referring to FIG. 2, a unit memory cell MC may include the memory element ME and the selection element SE. In some example embodiments, the selection element SE may be a MOS FET, and the memory element ME may include a magnetic tunnel junction MTJ. The magnetic tunnel junction MTJ may be coupled between the bit line BL and the selection element SE, and the selection element SE may be coupled between the magnetic tunnel junction MTJ and the source line SL and may be controlled by the word line WL.

The magnetic tunnel junction MTJ may include a plurality of magnetic layers FL and RL and a tunnel barrier layer TBL interposed between the magnetic layers FL and RL. One of the magnetic layers may have a fixed magnetization direction, regardless of the presence of an external magnetic field generated under a typical user condition, and thus, it may serve as a reference layer RL of the magnetic tunnel junction MTJ. The other of the magnetic layers may be configured to have a variable magnetization direction, which can be switched by an external magnetic field applied thereto, and thus, it may serve as a free layer FL of the magnetic tunnel junction MTJ.

A difference in magnetization direction between the magnetic layers FL and RL may lead to a change in electric resistance of the magnetic tunnel junction MTJ, and this change may be used to store data in the unit memory cell MC. This means that the electrical resistance of the magnetic tunnel junction MTJ can be controlled by changing the magnetization direction of the free layer FL. For example, the electric resistance of the magnetic tunnel junction MTJ may be much higher when magnetization directions of the reference and free layers RL and FL are anti-parallel than when they are parallel.

Figure 3:
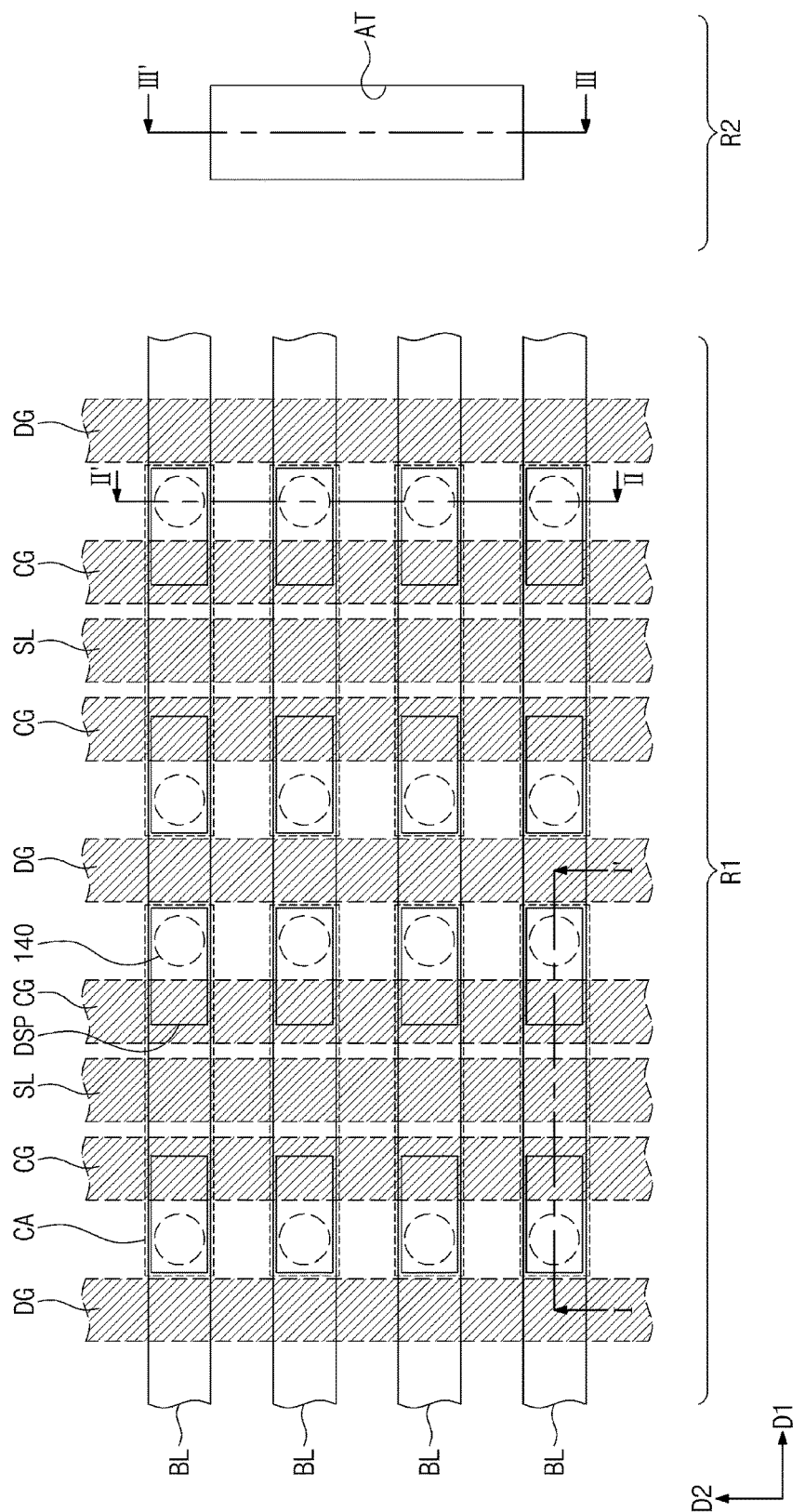
FIG. 3 is a plan view illustrating a semiconductor memory device according to some example embodiments of the inventive concepts.

FIG. 3 is a plan view illustrating a semiconductor memory device according to some example embodiments of the inventive concepts. FIG. 4, FIG. 5, FIG. 6, FIG. 7, FIG. 8, FIG. 9, FIG. 10, and FIG. 11 are sectional views taken along cross-sectional view lines I-I', II-II', and III-III' of FIG. 3 to illustrate a method of fabricating a semiconductor memory device, according to some example embodiments of the inventive concepts. FIG. 12A and FIG. 12B are enlarged sectional views illustrating a portion (e.g., a portion 'A' of FIG. 11) of a semiconductor memory device according to some example embodiments of the inventive concepts.

Figure 4:
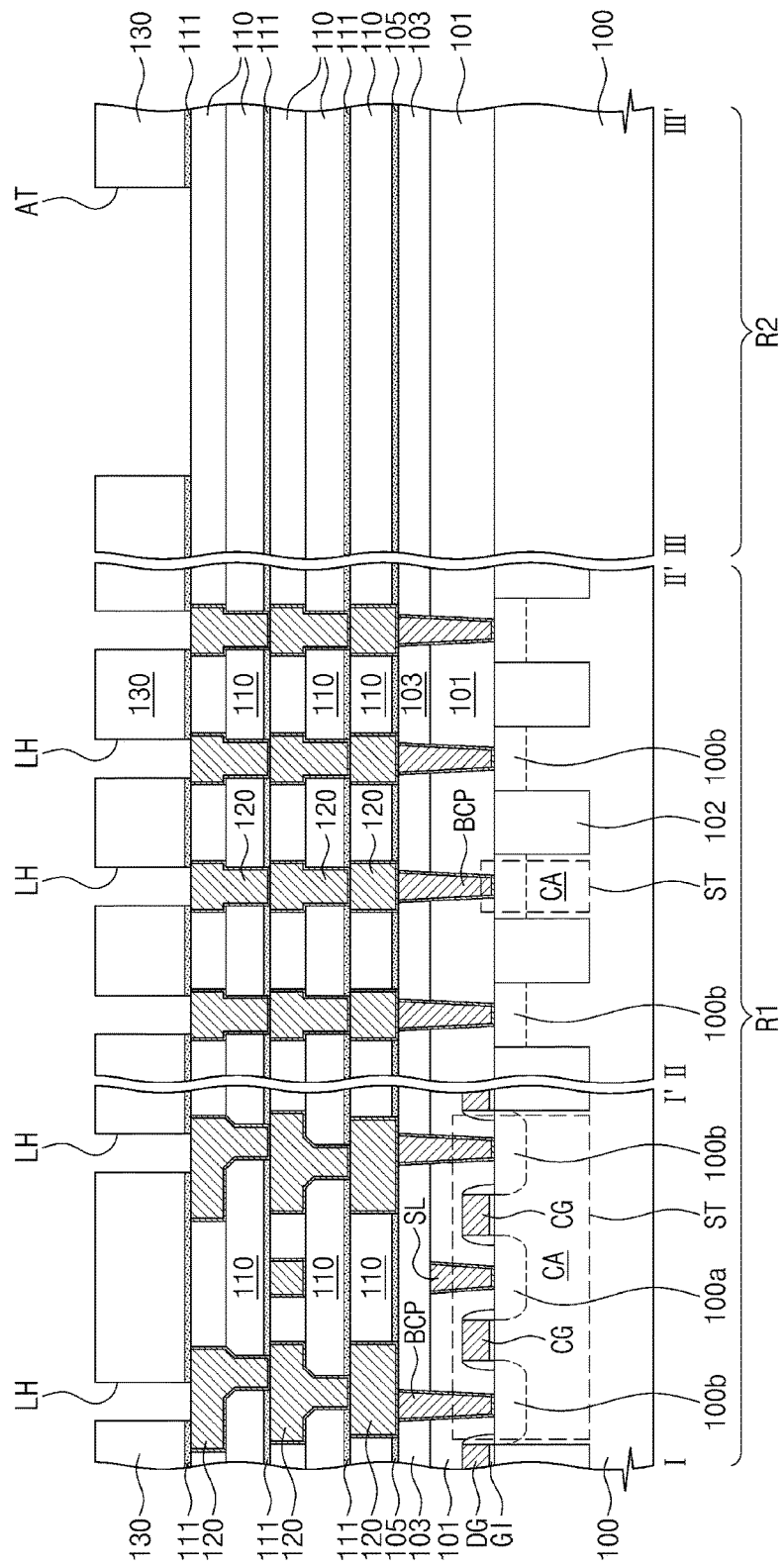
FIG. 4, FIG. 5, FIG. 6, FIG. 7, FIG. 8, FIG. 9, FIG. 10, and FIG. 11 are sectional views taken along cross-sectional view lines I-I', II-II', and III-III' of FIG. 3 to illustrate a method of fabricating a semiconductor memory device, according to some example embodiments of the inventive concepts.

Referring to FIGS. 3 and 4, a semiconductor substrate 100 may include a first region R1 and a second region R2. The semiconductor substrate 100 may be a silicon substrate, a germanium substrate, or a silicon-germanium substrate.

A memory cell array may be formed on the first region R1 of the semiconductor substrate 100, and logic cells or peripheral circuit patterns (e.g., alignment keys or photo keys) may be formed on the second region R2 of the semiconductor substrate 100. For example, the first region R1 may be a memory cell array region, and the second region R2 may be a peripheral circuit region or a scribe line region.

Selection transistors ST, which may be used as the selection element SE described with reference to FIG. 2, may be formed on the first region R1 of the semiconductor substrate 100. The selection transistors ST may include cell active patterns CA, cell gate electrodes CG crossing the cell active patterns CA, and first and second impurity regions 100a and 100b, which are formed in portions of the cell active patterns CA located at both sides of each of the cell gate electrodes CG.

For example, device isolation patterns 102 may be formed in the first region R1 of the semiconductor substrate 100 to define the cell active patterns CA. Each of the cell active patterns CA may be defined between adjacent ones of the device isolation patterns 102. As an example, each of the cell active patterns CA may be a line- or bar-shaped pattern, which is elongated in a first direction D1. The cell active patterns CA may be doped with impurities to have a first conductivity type.

The cell gate electrodes CG and dummy gate electrodes DG may be formed on the first region R1 of the semiconductor substrate 100 to cross the cell active patterns CA and the device isolation patterns 102. Each of the cell and dummy gate electrodes CG and DG may be a line-shaped pattern extending in a second direction D2. A gate insulating layer GI may be provided between the cell gate electrode CG and the semiconductor substrate 100 and between the dummy gate electrode DG and the semiconductor substrate 100.

The cell gate electrodes CG and the dummy gate electrodes DG may include at least one of, for example, doped semiconductor materials, metallic materials, conductive metal nitride materials, or metal-semiconductor compound materials. The gate insulating layer GI may include at least one of silicon oxide, silicon nitride, silicon oxynitride, or high-k dielectric materials.

Each of the first impurity regions 100a may be formed in a portion of the cell active pattern CA located at a side of the cell gate electrode CG, and each of the second impurity regions 100b may be formed in an opposite portion of the cell active pattern CA located at an opposite side of the cell gate electrode CG. The first and second impurity regions 100a and 100b may be doped with dopants to have a second conductivity type (e.g., n-type), which is different from the first conductivity type (e.g., p-type) of the cell active patterns CA. In some example embodiments, the first and second impurity regions 100a and 100b may serve as source/drain impurity regions (e.g., source regions and drain regions, respectively) of the selection transistor ST.

A first lower insulating layer 101 may be formed to fully cover the first and second regions R1 and R2 of the semiconductor substrate 100. The first lower insulating layer 101 may be formed to cover the selection transistors ST.

The source lines SL may be formed on the first region R1 to penetrate the first lower insulating layer 101, and each of the source lines SL may be coupled to the first impurity regions 100a. The source lines SL may extend in the second direction D2 and parallel to each other. When viewed in a plan view, each of the source lines SL may be provided between adjacent ones of the cell gate electrodes CG. The source line SL may be formed to have a top surface that is substantially coplanar with that of the first lower insulating layer 101. The formation of the source lines SL may include patterning the first lower insulating layer 101 on the first region R1 to form source trenches exposing the first impurity regions 100a and then to fill the source trenches with a conductive material.

A second lower insulating layer 103 may be formed to cover the entire top surface of the first lower insulating layer 101, and then, buried contact plugs BCP may be formed on the first region R1 to penetrate the second lower insulating layer 103 and the first lower insulating layer 101. The buried contact plugs BCP may be electrically coupled to the second impurity regions 100b, respectively.

In some example embodiments, the source line SL and the buried contact plugs BCP may be formed of or include at least one of metallic materials (e.g., tungsten, titanium, and tantalum) or conductive metal nitride materials (e.g., titanium nitride, tantalum nitride, and tungsten nitride). In some example embodiments, the source line SL and the buried contact plugs BCP may be formed of or include at least one of impurity-doped semiconductor materials.

A capping interlayered insulating layer 105 may be formed on the second lower insulating layer 103 to cover top surfaces of the buried and peripheral contact plugs BCP and PCP. As further shown in at least FIGS. 3 and 4, the capping interlayered insulating layer 105 covers the selection transistor ST. The capping interlayered insulating layer 105 may be formed of (e.g., at least partially comprise) an insulating material having an etch selectivity with respect to the second lower insulating layer 103.

Intermediate insulating layers 110 and diffusion barrier layers 111 may be alternately formed on the capping interlayered insulating layer 105. In some example embodiments, the intermediate insulating layers 110 may be formed of or include at least one of HDP oxide, TEOS, PE-TEOS, USG, BSG, PSG, BPSG, SOG, TOSZ, or combination thereof. In some example embodiments, the intermediate insulating layers 110 may be formed of a dielectric material having a dielectric constant lower than that of silicon oxide and may be composed of at least one layer. For example, the intermediate insulating layers 110 may be formed of fluorine-doped oxide (FSG), carbon-doped oxide, silicon oxide, hydrogen silsesquioxane (HSQ; SiO:H), methyl silsesquioxane (MSQ; SiO:CH3), or a-SiOC (SiOC:H). The diffusion barrier layers 111 may be formed of at least one of silicon nitride (SiN), silicon oxynitride (SiON), silicon carbide (SiC), silicon carbon nitride (SiCN), or combination thereof.

Lower interconnection lines 120 may be vertically stacked on the first region R1 and may be placed in the intermediate insulating layers 110. Each of the lower interconnection lines 120 may include a via portion and a line portion. The lower interconnection lines 120 may be electrically coupled to the buried contact plugs BCP or the source lines SL. Some of the lower interconnection lines 120 may be electrically coupled to the selection transistors, which are formed on the semiconductor substrate 100. Others of the lower interconnection lines 120 may be electrically coupled to the source lines SL, which are formed on the semiconductor substrate 100. The lower interconnection lines 120 may be formed of or include, for example, copper or copper alloys. Here, the copper alloys may be copper compounds containing at least one of C, Ag, Co, Ta, In, Sn, Zn, Mn, Ti, Mg, Cr, Ge, Sr, Pt, Mg, Al, or Zr. In some example embodiments, the lower interconnection lines 120 may be formed of or include at least one of metallic materials (e.g., tungsten, titanium, and tantalum) or conductive metal nitride materials (e.g., titanium nitride, tantalum nitride, and tungsten nitride).

An upper insulating layer 130 may be formed on the uppermost layer of the diffusion barrier layers 111. The upper insulating layer 130 as described herein may be interchangeably referred to herein as an "interlayered insulating layer" that is covering the selection transistor ST. The upper insulating layer 130 may be formed in such a way that top surfaces of two portions on the first and second regions R1 and R2 are positioned at substantially the same level. The upper insulating layer 130 may be formed of or include at least one of HDP oxide, TEOS, PE-TEOS, USG, BSG, PSG, BPSG, SOG, TOSZ or combinations thereof. In some example embodiments, the upper insulating layer 130 may be formed of a dielectric material having a dielectric constant lower than that of silicon oxide.

Referring to FIG. 4, lower contact holes LH may be formed in the upper insulating layer 130 of the first region R1, and an alignment trench AT may be formed in the upper insulating layer 130 of the second region R2.

The formation of the lower contact holes LH and the alignment trench AT may include forming a mask pattern (not shown) on the upper insulating layer 130 and anisotropically etching the upper insulating layer 130 using the mask pattern as an etch mask. The lower contact holes LH may be formed to expose the lower interconnection lines 120, and the alignment trench AT may be formed to expose the uppermost layer of the intermediate insulating layers 110 or diffusion barrier layers 111. The alignment trench AT and the contact holes LH may be formed at the same time (e.g., concurrently), and in this case, the lower contact holes LH and the alignment trench AT may be formed to have substantially the same depth. In some example embodiments, the lower contact holes LH and the alignment trench AT may have a depth of about 1000 Å to 2000 Å. In some example embodiments, the alignment trench AT may be formed to have a depth that is larger than that of the lower contact holes LH.

In some example embodiments, the alignment trench AT on the second region R2 may be used to align a photomask in a subsequent photolithography process with structures on the semiconductor substrate 100. In the photolithography process, the presence of the alignment trench AT may lead to a spatial variation in optical characteristics (e.g., intensity) of light to be reflected from the semiconductor substrate 100. Thus, the presence of the alignment trench AT may be recognized by measuring such a spatial variation in optical characteristics of the reflected light and may be used to precisely align a photomask to the semiconductor substrate 100. In some example embodiments, a particular (or, alternatively, predetermined) depth of the alignment trench AT may be consistently maintained with minimum variation during subsequent processes performed, and this may make it possible to precisely recognize the reflected light in the alignment step.

Figure 5:
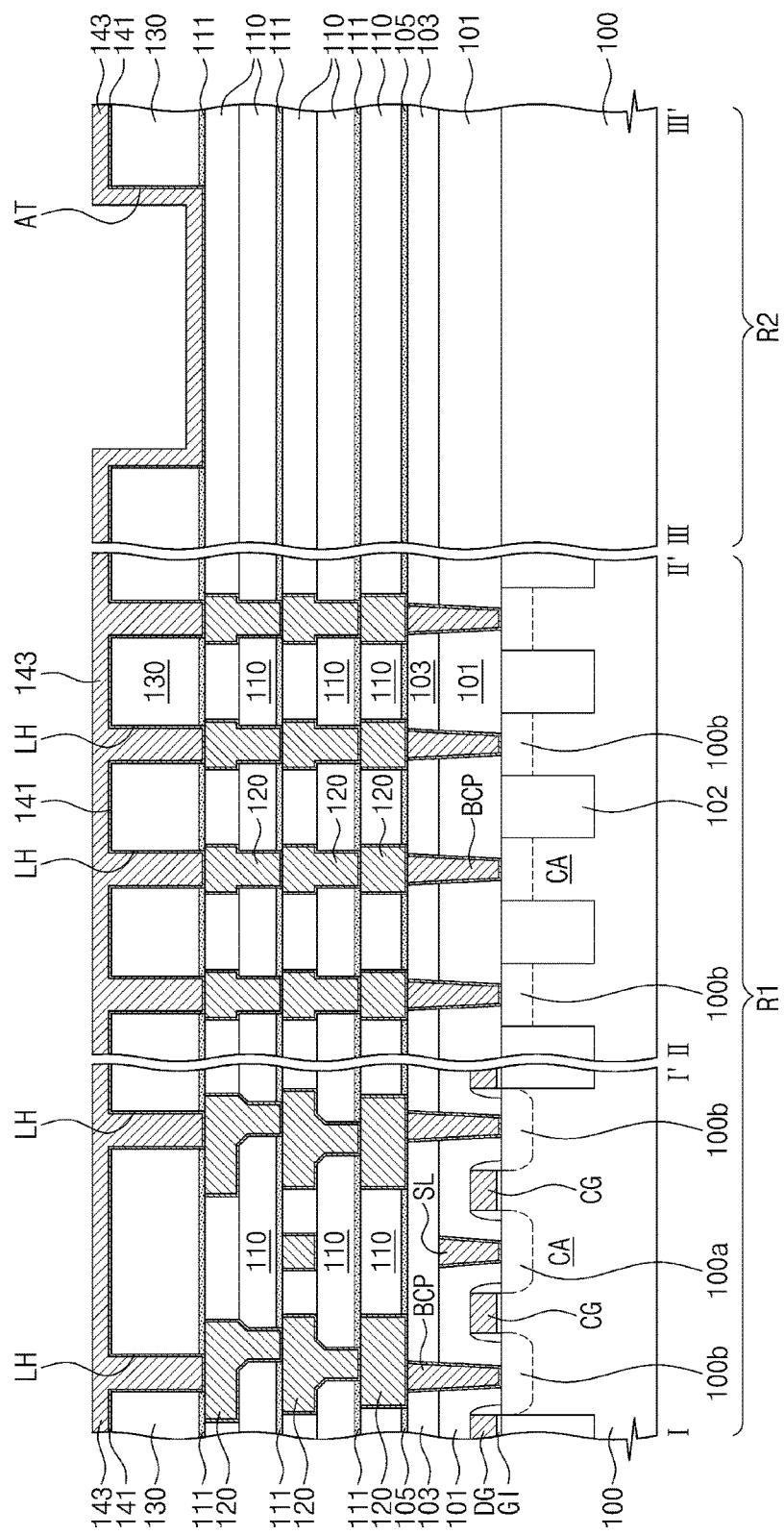

Referring to FIG. 5, a barrier metal layer 141 and a metal layer 143 may be sequentially deposited on the upper insulating layer 130, in which the lower contact holes LH and the alignment trench AT are formed. The barrier metal layer 141 and the metal layer 143 may be formed using a technique capable of forming a layer with high step coverage (for example, chemical vapor deposition (CVD), physical vapor deposition (PVD), or atomic layer deposition (ALD)).

The barrier metal layer 141 may be formed to conformally cover a top surface of the upper insulating layer 130, inner surfaces of the lower contact holes LH, and an inner surface of the alignment trench AT. The metal layer 143 may be formed to fully fill the lower contact holes LH on the first region R1. The metal layer 143 may be formed to conformally cover the inner surface of the alignment trench AT on the second region R2. A thickness of the metal layer 143 may be larger than half a diameter of the lower contact holes LH and may be smaller than half the largest width of the alignment trench AT. In addition, the thickness of the metal layer 143 may be smaller than about half the depth of the alignment trench AT. The metal layer 143 may be deposited to a thickness of about 300 □-1500 □.

The barrier metal layer 141 may be formed of or include a first metallic material, which is at least one of conductive metal nitride materials, such as titanium nitride, tantalum nitride, and tungsten nitride. The metal layer 143 may be formed of or include a second metallic material, which is at least one of metallic materials, such as tungsten, titanium, and tantalum. As an example, the barrier metal layer 141 may be a titanium nitride layer, and the metal layer 143 may be a tungsten layer.

Figure 6:
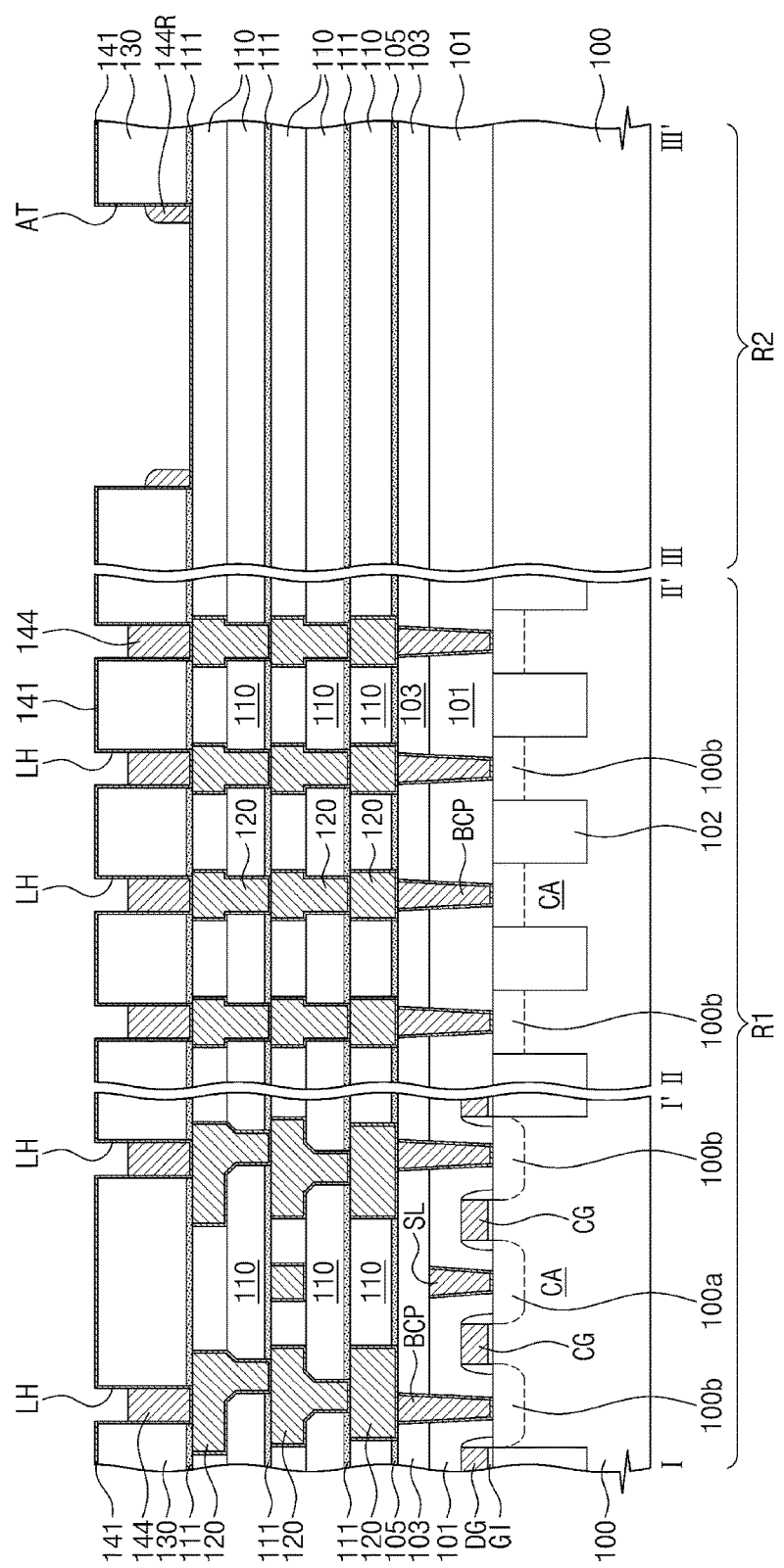

Referring to FIG. 6, the metal layer 143 may be recessed to form metal patterns 144 in the lower contact holes LH and to form residual metal patterns 144R on inner side surfaces of the alignment trench AT. The metal patterns 144 and the residual metal patterns 144R may be formed to have top surfaces that are positioned at a level lower than that of the upper insulating layer 130.

The recessing of the metal layer 143 may include performing an anisotropic etching process on the metal layer 143. As a result of the anisotropic etching process, the barrier metal layer 141 on the upper insulating layer 130 may be exposed or the top surface of the upper insulating layer 130 may be exposed. The anisotropic etching process on the metal layer 143 may be performed using plasma, which is generated from an inductively-coupled plasma (ICP) source, a capacitively-coupled plasma (CCP) source, an electron cyclotron resonance (ECR) plasma source, a helicon-wave excited plasma (HWEP) source, or an adaptively-coupled plasma (ACP) source.

In some example embodiments, in the case where a plasma etching process is used to form the metal patterns 144, the metal patterns 144 may have uneven top surfaces 144s, as shown in FIG. 12A. When the metal layer 143 on the first region R1 is etched, an etching amount of the metal layer 143 may be greater on a center region of the lower contact hole LH than on an edge region of the lower contact hole LH. Accordingly, as shown in FIG. 12A, the top surface 144s of the metal pattern 144 may have a downward curved shape. For example, a height H1 of the metal pattern 144 near a center of the lower contact hole LH may be smaller than a height H2 of the metal pattern 144 near a side surface of the lower contact hole LH. Restated, a height of a center portion of the metal pattern 144 (e.g., height H1) may be smaller than a height of an edge portion of the metal pattern 144 (e.g., height H2).

When the metal patterns 144 are formed on the first region R1, the metal layer 143 on the second region R2 may be etched to expose a bottom surface of the alignment trench AT, but a portion of the metal layer 143 may remain on inner surfaces of the alignment trench AT, thereby forming the residual metal patterns 144R. In some example embodiments, the barrier metal layer 141 on the second region R2 may be partially etched during the formation of the residual metal patterns 144R.

In some example embodiments, when the metal patterns 144 are formed on the first region R1, an anisotropic etching process may be used instead of a chemical mechanical polishing (CMP) process, and this may make it possible to suppress a reduction in height difference between the top surface of the upper insulating layer 130 and the bottom surface of the alignment trench AT on the second region R2.

Figure 7:
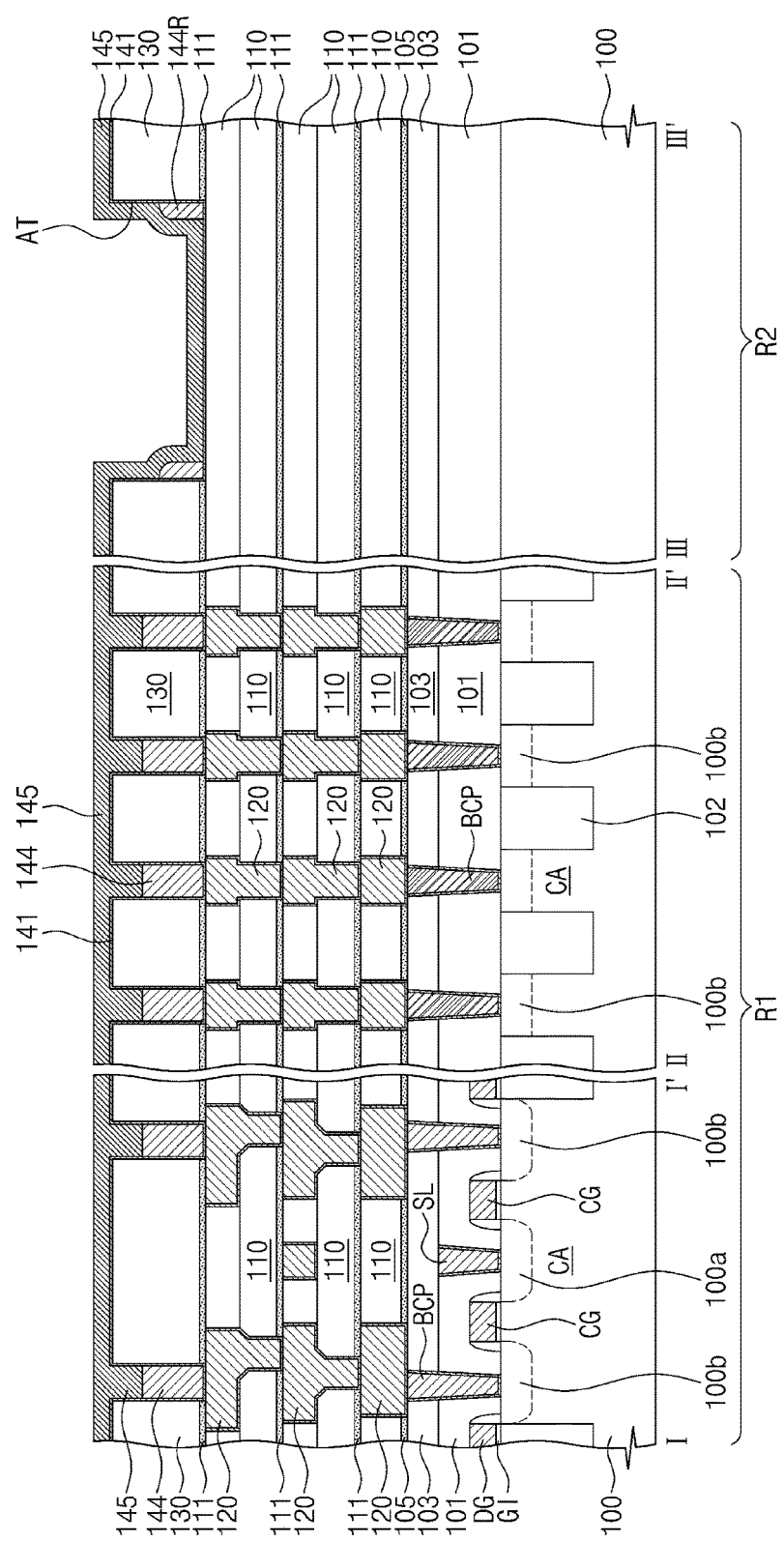

Referring to FIG. 7, after the formation of the metal patterns 144 and the residual metal patterns 144R, a capping metal layer 145 may be deposited on the upper insulating layer 130. The capping metal layer 145 may be formed using a technique capable of forming a layer with high step coverage (for example, CVD, PVD, or ALD methods).

The capping metal layer 145 may be formed to completely fill the lower contact holes LH with the metal patterns 144. The capping metal layer 145 may be formed to conformally cover the inner surface of the alignment trench AT with the residual metal patterns 144R. A thickness of the capping metal layer 145 may be smaller than about half the depth of the alignment trench AT. The capping metal layer 145 may be deposited to a thickness of about 200 Å-1000 Å.

The capping metal layer 145 may include a first metallic material, which is different from the metal pattern 144. The first metallic material may be or include at least one of conductive metal nitride materials, such as titanium nitride, tantalum nitride, and tungsten nitride. In some example embodiments, the capping metal layer 145 may be formed of the same metallic material (e.g., titanium nitride or tantalum nitride) as the barrier metal layer 141.

Figure 8:
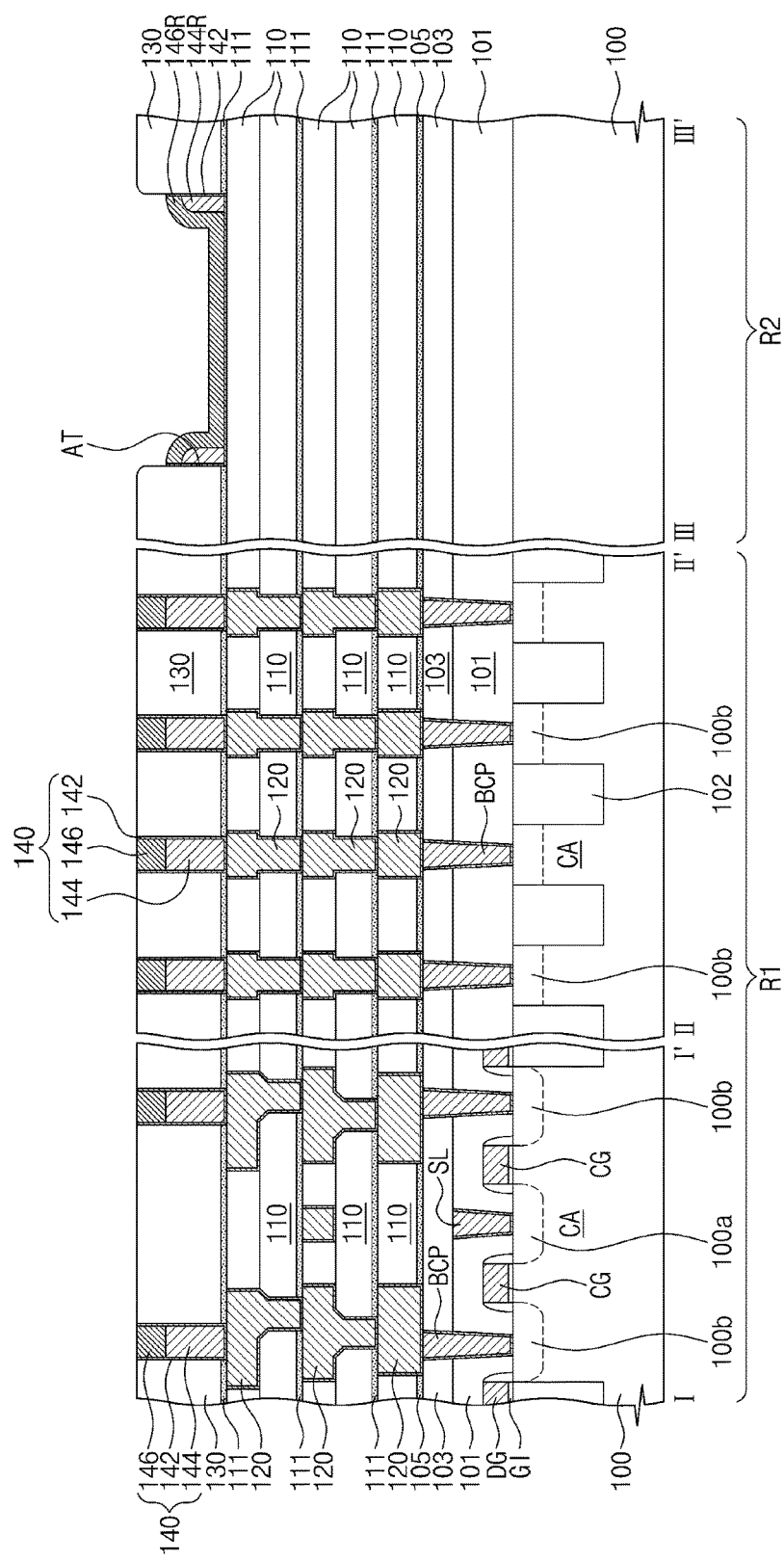

Referring to FIGS. 8 and 12A, a planarization process may be performed on the capping metal layer 145 to form capping metal patterns 146 and barrier metal patterns 142 on the first region R1. When the capping metal patterns 146 are formed on the first region R1, a residual capping metal pattern 146R may be formed in the alignment trench AT of the second region R2.

The planarization process on the capping metal layer 145 may be performed using a CMP process. In the case where the CMP process is used, not only top surfaces of the capping metal patterns 146 but also the top surface 130s of the upper insulating layer 130 may be planarized. Accordingly, the capping metal patterns 146 may be formed to have top surfaces 146s that are substantially coplanar with the top surface 130s of the upper insulating layer 130. In addition, as a result of the planarization process, the top surface 146s of the capping metal pattern 146 may be formed to have a more uniform profile, compared with the top surface 144s of the metal pattern 144. For example, as shown in FIG. 12A, the top surface 146s of the capping metal pattern 146 may have flatness better than that of the top surface 144s of the metal pattern 144. Also, the top surface 146s of the capping metal pattern 146 may have a surface roughness that is smaller than that of the top surface 144s of the metal pattern 144. In the case where the capping metal pattern 146 is formed to have the above features, it may be possible to prevent or suppress crystallinity of a magnetic tunnel junction pattern, which will be formed in a subsequent process, from being affected by crystallinity and surface roughness of the metal pattern 144.

In the case where the capping metal patterns 146 are formed to have the above features, a lower contact plug 140 may be formed in each of the lower contact holes LH. In other words, the lower contact plug 140 may include the barrier metal pattern 142, the metal pattern 144, and the capping metal pattern 146. As shown in FIG. 12A, the top surface 144s of the metal pattern 144 may be in direct contact with the capping metal pattern 146. The top surface 146s of the capping metal pattern 146 may have flatness better than that of the top surface 144s of the metal pattern 144. The top surface 146s of the capping metal pattern 146 may have a surface roughness of about 10 □ or less, and the top surface 144s of the metal pattern 144 may have a surface roughness of about 50 □ or less. Furthermore, a thickness T2 of the capping metal pattern 146 on the top surface of the metal pattern 144 may be larger than a thickness T1 of the barrier metal pattern 142 on the side surface of the metal pattern 144.

Restated, and as shown in at least FIG. 12A, the lower contact plug 140 may include a barrier metal pattern 142, where the barrier metal pattern 142 covers a side surface of the metal pattern 144 and a bottom surface of the metal pattern 144, the barrier metal pattern 142 has a first thickness T1 on the side surface of the metal pattern 144, and the capping metal pattern 146 has a second thickness (e.g., T2) on the top surface 144s of the metal pattern 144, the second thickness (e.g., T2) greater than the first thickness T1. The capping metal pattern 146 and the barrier metal pattern 142 may include a common material. As further shown in FIG. 12A, the barrier metal pattern 142 may cover a side surface of the capping metal pattern 146.

Referring to FIGS. 8 and 12A, the lower contact plug 140 may include a metal pattern 144 and a capping metal pattern 146 in contact with a top surface 144s of the metal pattern 144, the top surface 144s of the metal pattern 144 having a first surface roughness (e.g., about 50 □ or less), the capping metal pattern 146 including a top surface 146s, the top surface 146s of the capping metal pattern 146 having a second surface roughness (e.g., about 10 □ or less), the second surface roughness smaller than the first surface roughness.

In some example embodiments, the metal pattern 144 includes a first metallic material, and the capping metal pattern 146 includes a second metallic material. The second metallic material may be different from the first metallic material. The first metallic material may include tungsten, and the second metallic material may include titanium nitride.

As shown in at least FIG. 12A, the top surface 146s of the capping metal pattern 146 may be at a level that is higher than a level of a top surface 130s of the upper insulating layer 130.

When the capping metal patterns 146 are formed on the first region R1, the capping metal layer 145 may be mechanically and chemically removed from the top surface of the upper insulating layer 130 on the second region R2, as a result of the planarization process on the capping metal layer 145, and thus, and an upper corner portion of the alignment trench AT may be exposed. In addition, the upper corner portion of the alignment trench AT may be rounded by the planarization process.

In some example embodiments, since the planarization process is performed once during the formation of the lower contact plugs 140 including the metal pattern 144 and the capping metal pattern 146, it may be possible to suppress the upper insulating layer 130 on the second region R2 from being recessed. Accordingly, it may be possible to suppress a height difference between the bottom surface of the alignment trench AT and the top surface of the upper insulating layer 130 on the second region R2 from being reduced. This may make it possible to improve reliability in a subsequent photolithography process, which will be performed after the formation of the lower contact plugs 140.

As shown in FIG. 8, the lower contact plug 140 may be coupled to a drain region of the selection transistor ST (e.g., via the one or more lower interconnection lines 120) and may be configured to penetrate the upper insulating layer 130.

Figure 9:
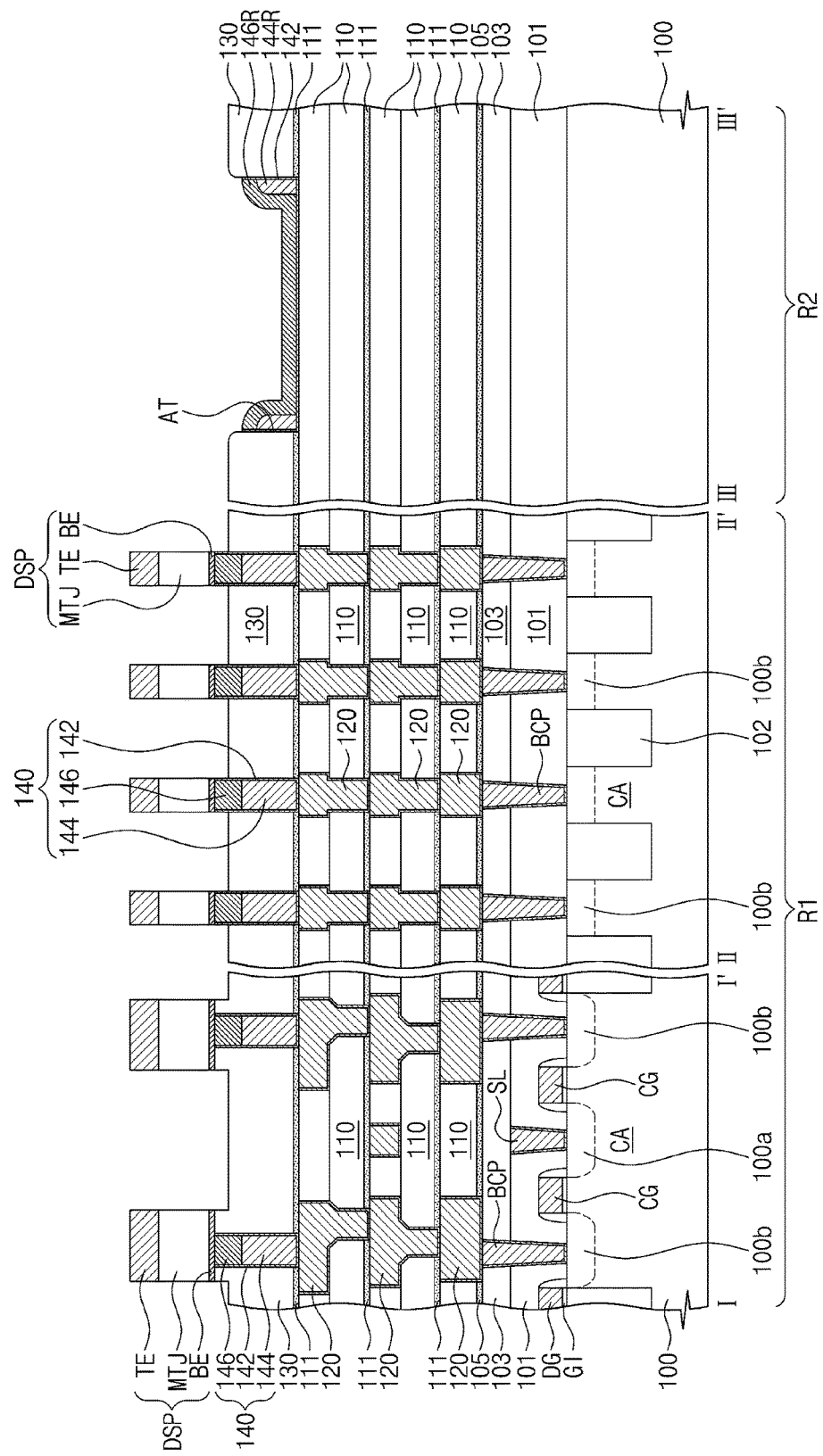

Referring to FIGS. 3 and 9, data storage patterns DSP may be formed on the upper insulating layer 130 of the first region R1. When viewed in a plan view, the data storage patterns DSP may be arranged to be spaced apart from each other (e.g., isolated from direct contact with each other) in the first direction D1 and the second direction D2 and may be coupled to the lower contact plugs 140, respectively. The data storage patterns DSP may be coupled to the second impurity regions 100b, respectively, through the lower contact plugs 140, the lower interconnection lines 120, and the buried contact plugs BCP. In other words, the data storage patterns DSP may be electrically coupled to the selection transistors ST, respectively.

Each of the data storage patterns DSP may include a bottom electrode BE, a top electrode TE, and a magnetic tunnel junction pattern MTJ interposed between the bottom and top electrodes BE and TE, and as shown in FIGS. 12A and 12B, the magnetic tunnel junction pattern MTJ may include a free magnetic layer FL, a reference magnetic layer RL, and a tunnel barrier layer TBL interposed between the free and reference magnetic layers FL and RL. In some example embodiments, the bottom electrode BE of each of the data storage patterns DSP may be in direct contact with the capping metal pattern 146 of the lower contact plug 140.

Restated, as shown in at least FIGS. 3 and 9, a magnetic tunnel junction pattern MTJ may be coupled to the lower contact plug 140. The magnetic tunnel junction pattern MTJ may include a bottom electrode BE, a top electrode TE, a lower magnetic layer (e.g., RL) and an upper magnetic layer (e.g., FL) between the top electrode TE and the bottom electrode BE, and a tunnel barrier layer TBL between the lower magnetic layer (e.g., RL) and the upper magnetic layer (e.g., FL).

Further restated, as shown in at least FIGS. 3 and 9, the lower contact plug 140 may include a metal pattern 144 penetrating a lower portion of the upper insulating layer 130 (the metal pattern 144 may include a first metallic material), and a capping metal pattern 146 in direct contact with the metal pattern 144 and penetrating an upper portion of the upper insulating layer 130. As shown in at least FIGS. 12A and 12B, the metal pattern 144 may have a downwardly curved top surface 144s. As shown in at least FIGS. 3 and 9, the magnetic tunnel junction pattern MTJ may include a sequential stack of a bottom electrode BE, a lower magnetic layer (e.g., RL), a tunnel barrier layer TBL, an upper magnetic layer (e.g., FL), and a top electrode TE on the semiconductor substrate 100. As shown in at least FIG. 12, the bottom electrode BE may be in direct contact with a top surface 146s of the capping metal pattern 146 of the lower contact plug 140. The capping metal pattern 146 may include a second metallic material, where the second metallic material is different from the first metallic material of the metal pattern 144, and the capping metal pattern 146 may have a flat top surface 146s.

Each of the data storage patterns DSP may have different widths in the first and second directions D1 and D2. When measured in the first or second direction D1 or D2, the width of the data storage pattern DSP may be substantially equal to that of the lower contact plug 140. In addition, when measured in the first or second direction D1 or D2, the width of the data storage pattern DSP at a high level may be smaller than that at a low level. In other words, each of the data storage patterns DSP may have an inclined side surface.

The bottom electrode BE of the data storage pattern DSP may include a conductive metal nitride material. For example, the bottom electrode BE may be formed of or include at least one of titanium nitride (TiN), tantalum nitride (TaN), tungsten nitride (WN), or titanium aluminum nitride (TiAlN). In some example embodiments, the bottom electrode BE may be formed of the same material as the capping metal pattern 146 of the lower contact plug 140.

The top electrode TE of the data storage pattern DSP may include a barrier metal layer and a metal layer. Here, the barrier metal layer may be formed of or include at least one of, for example, Ta, TaN, TaSiN, Ti, TiN, TiSiN, W, or WN. The metal layer may be formed of or include at least one of copper, tungsten, titanium, tantalum, ruthenium, or platinum.

Some examples of the data storage patterns DSP will be described in more detail with reference to FIGS. 15 to 18.

The formation of the data storage patterns DSP may include sequentially forming a bottom electrode layer, a lower magnetic layer, a tunnel barrier layer, an upper magnetic layer, and a top electrode layer on the upper insulating layer 130 and sequentially etching the top electrode layer, the upper magnetic layer, the tunnel barrier layer, the lower magnetic layer, and the bottom electrode layer using an etch mask pattern (not shown) to partially expose the upper insulating layer 130. When a patterning process is performed to form the data storage patterns DSP, the alignment trench AT on the second region R2 may be used for alignment of a photomask pattern.

During the etching process for forming the data storage patterns DSP, the upper insulating layer 130 may be over-etched and recessed. Accordingly, the top surface of the upper insulating layer 130 between the data storage patterns DSP may be positioned at a level lower than the top surfaces of the lower contact plugs 140. In addition, the upper insulating layer 130 may be recessed to partially expose side surfaces of the lower contact plugs 140.

In more detail, as shown in FIG. 12A, the top surface of the metal pattern 144 may be positioned at a level lower than the recessed top surface of the upper insulating layer 130. That is, an interface 147 between the metal pattern 144 and the capping metal pattern 146 may be positioned at a level lower than the recessed top surface of the upper insulating layer 130. In some example embodiments, as shown in FIG. 12B, the top surface 144s of the metal pattern 144 may be positioned above the recessed top surface of the upper insulating layer 130.

In each of the data storage patterns DSP, the bottom electrode BE may be in direct contact with the top surface of the lower contact plug 140 (i.e., the top surface 146s of the capping metal pattern 146), as shown in FIG. 12A. For example, as shown in at least FIG. 9, the top surface 146s of the capping metal pattern 146 may be in direct contact with the bottom electrode BE of the magnetic tunnel junction pattern MTJ. The capping metal pattern 146 and the bottom electrode BE may include a common metallic material. As shown in at least FIG. 12A, a width of the capping metal pattern 146 may be smaller than a width of the bottom electrode BE of the magnetic tunnel junction pattern MTJ. The bottom electrode BE of each of the data storage patterns DSP may be spaced apart from the metal pattern 144 having the uneven top surface. Thus, as shown in at least FIG. 9, the top surface 144s of the metal pattern 144 may be isolated from direct contact with the magnetic tunnel junction pattern MTJ. Although an interface is illustrated to be formed between the bottom electrode BE and the capping metal pattern 146, there is no such interface. For example, in the case where the bottom electrode BE and the capping metal pattern 146 are formed of the same material, the interface may not be formed between the bottom electrode BE and the capping metal pattern 146.

In some example embodiments, the capping metal pattern 146 may prevent the reference and free magnetic layers RL and FL and the tunnel barrier layer TBL, which are positioned on the bottom electrode BE, from being affected by crystallinity and surface roughness of the metal pattern 144, and this may make it possible to prevent reliability of the magnetic tunnel junction pattern from being deteriorated.

Figure 10:
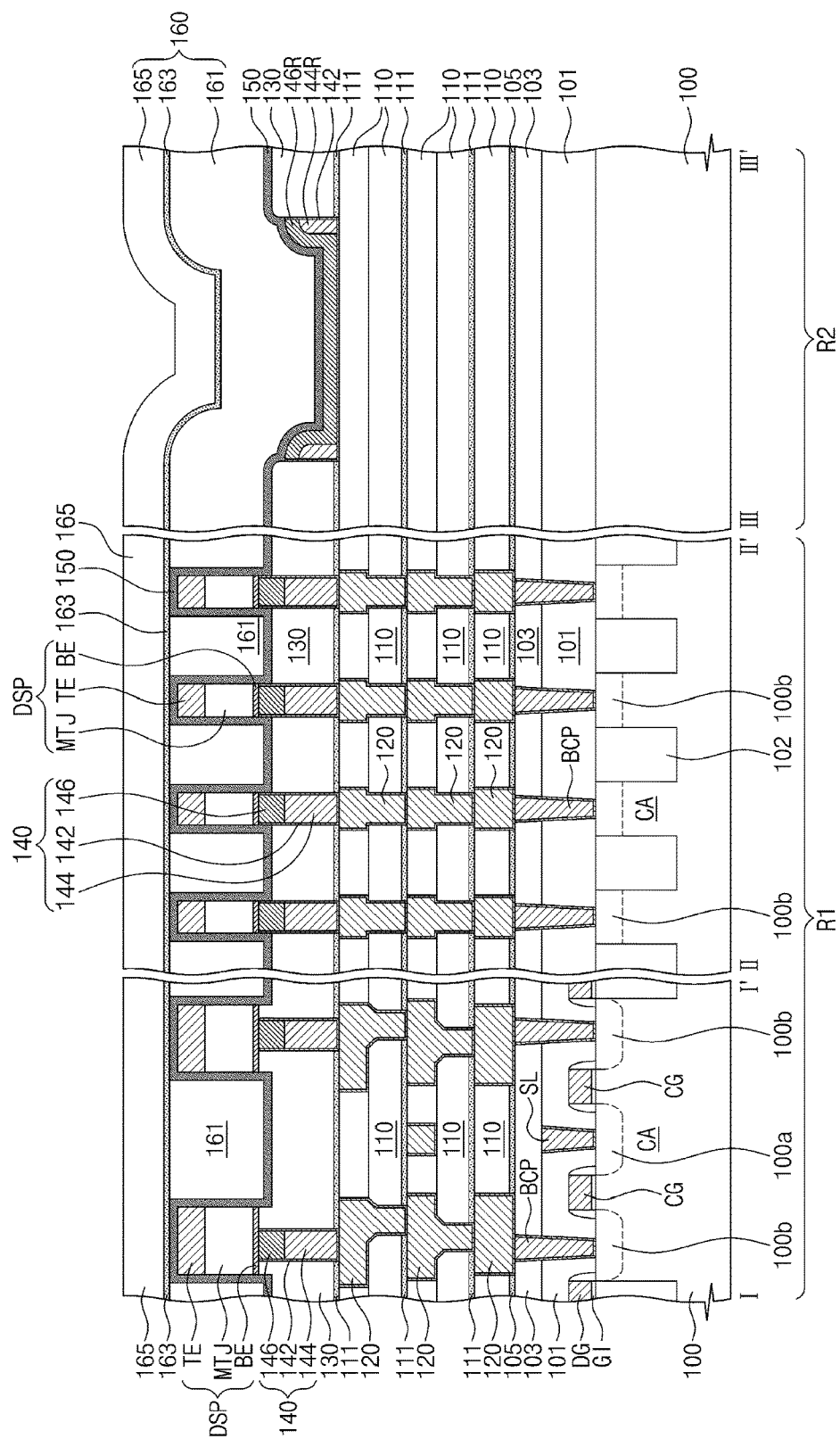

Referring to FIGS. 3 and 10, a capping insulating layer 150 may be formed to have a uniform thickness, on the first and second regions R1 and R2. The capping insulating layer 150 may be formed on the upper insulating layer 130 of the first region R1 to conformally cover the data storage patterns DSP. The capping insulating layer 150 may be in direct contact with side surfaces of the data storage patterns DSP and portions of side surfaces of the lower contact plugs 140. Restated, and as shown in at least FIG. 10, a capping insulating layer 150 may be on the upper insulating layer 130, where the capping insulating layer 150 is covering a side surface of at least one magnetic tunnel junction pattern MTJ. As shown in at least FIG. 12A, an interface 147 between the metal pattern 144 and the capping metal pattern 146 may be at a level lower than a level of a bottom surface of the capping insulating layer 150. On the second region R2, the capping insulating layer 150 may be formed to conformally cover the residual capping metal pattern 146R.

The capping insulating layer 150 may be formed of (e.g., at least partially comprise) an insulating material having an etch selectivity with respect to the upper insulating layer 130. The capping insulating layer 150 may be formed of or include at least one of, for example, silicon nitride (SiN), silicon oxynitride (SiON), silicon carbide (SiC), silicon carbon nitride (SiCN), or any combination thereof.

A mold insulating layer 160 may be formed on the capping insulating layer 150 to fill gap regions between the data storage patterns DSP. The mold insulating layer 160 may include a first insulating layer 161, an etch stop layer 163, and a second insulating layer 165, which are sequentially stacked on the capping insulating layer 150. Each or at least one of the first and second insulating layers 161 and 165 may be formed of silicon oxide or a low-k dielectric material, whose dielectric constant is lower than that of silicon oxide. The etch stop layer 163 may be formed of or include an insulating material (e.g., at least one of silicon nitride (SiN), silicon oxynitride (SiON), silicon carbide (SiC), silicon carbon nitride (SiCN), or any combination thereof), which is selected to have an etch selectivity with respect to the first and second insulating layers 161 and 165.

The mold insulating layer 160 may be deposited to have a uniform thickness, on the first and second regions R1 and R2. Owing to the height difference caused by the alignment trench AT, a top surface of the mold insulating layer 160 may be formed to have a height difference on the second region R2.

Figure 11:
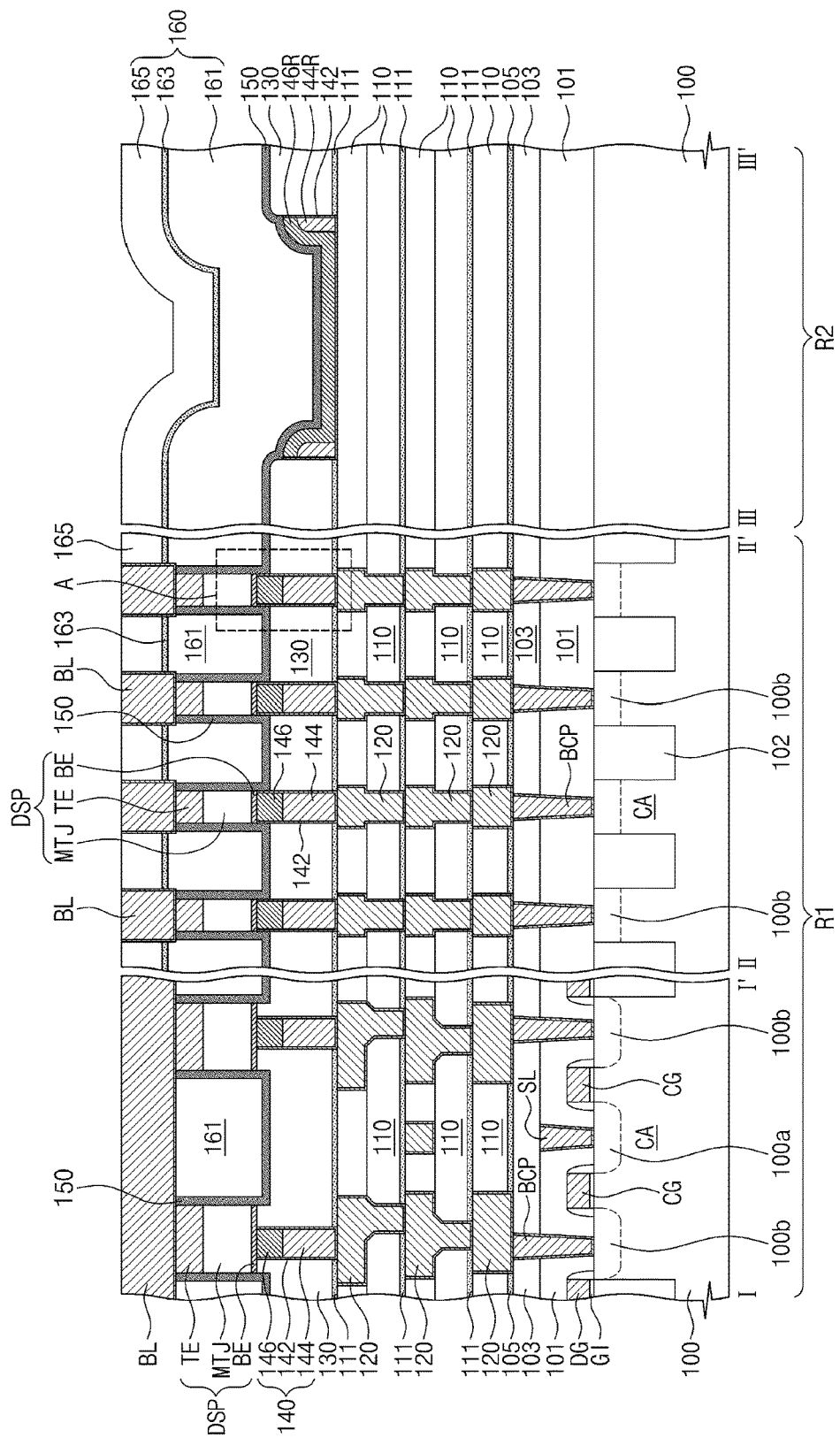
Figure 12A:
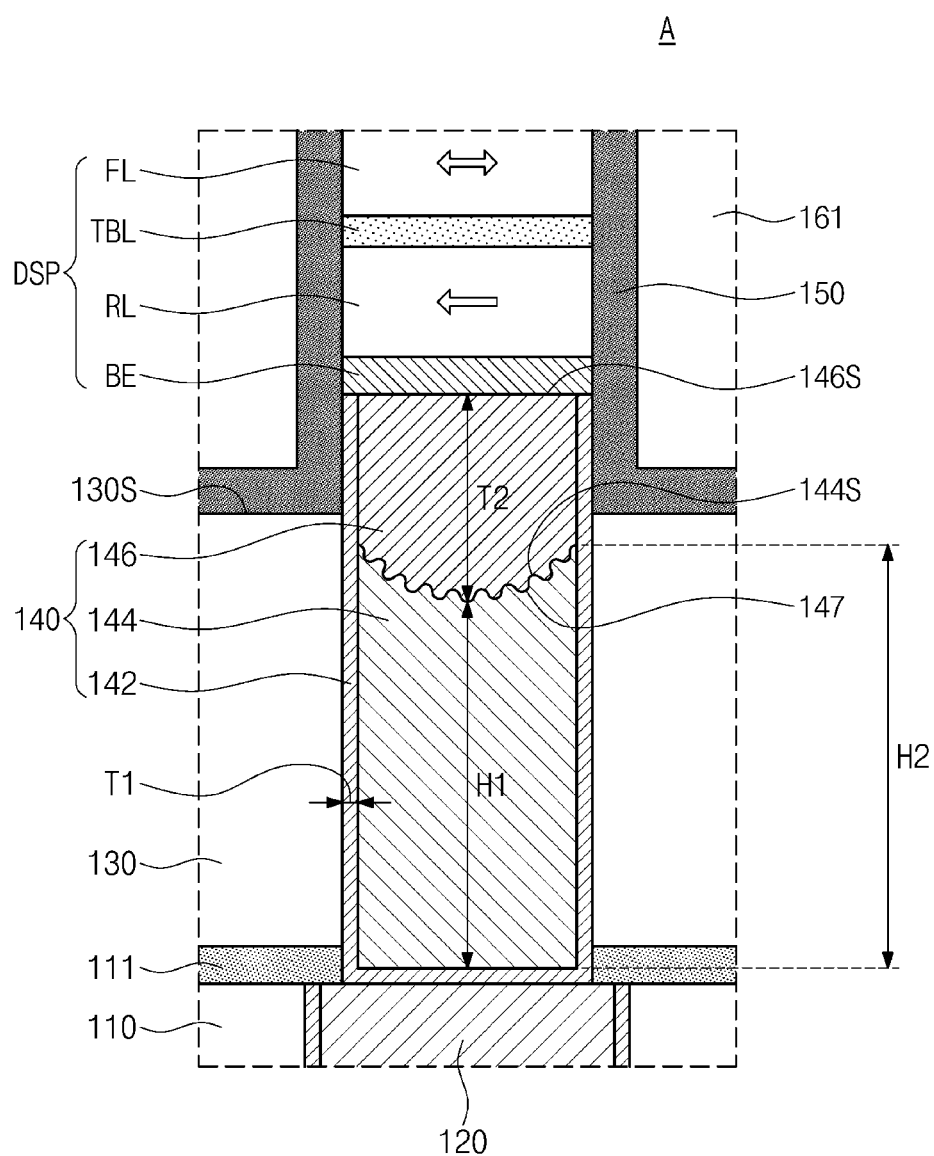
FIG. 12A and FIG. 12B are enlarged sectional views illustrating a portion (e.g., a portion 'A' of FIG. 11) of a semiconductor memory device according to some example embodiments of the inventive concepts.
Figure 12B:
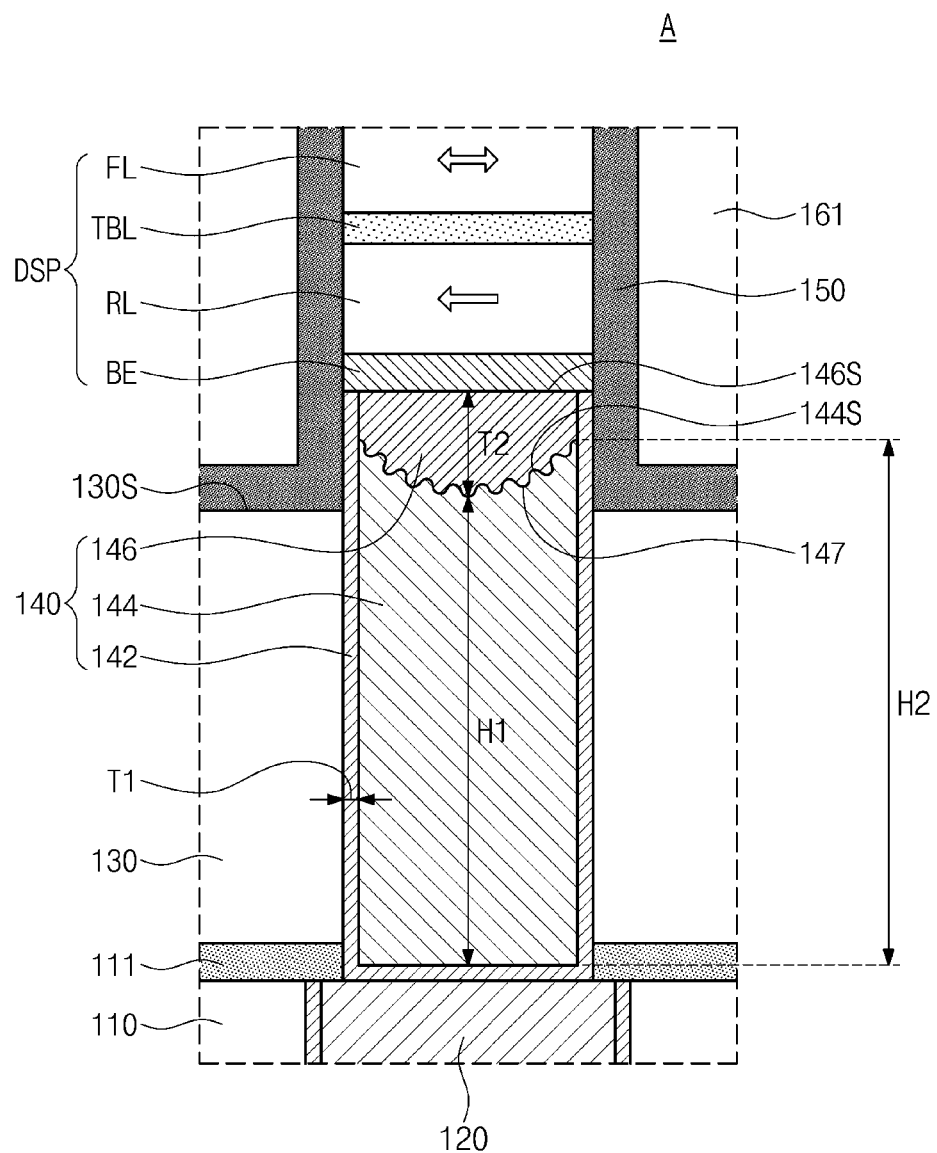

Referring to FIGS. 3 and 11, bit lines BL may be formed in the mold insulating layer 160 and on the first region R1. Each of the bit lines BL may be in contact with the top electrodes TE of the data storage patterns DSP, which are arranged in the first direction D1.

In some example embodiments, the formation of the bit lines BL may include patterning the mold insulating layer 160 and the capping insulating layer 150 to form cell trenches exposing the top electrodes of the data storage patterns DSP, forming a barrier metal layer to conformally cover inner surfaces of the cell trenches, forming a metal layer to fill the cell trenches with the barrier metal layer, and planarizing the barrier metal layer and the metal layer to expose the top surface of the mold insulating layer 160.

Figure 13:
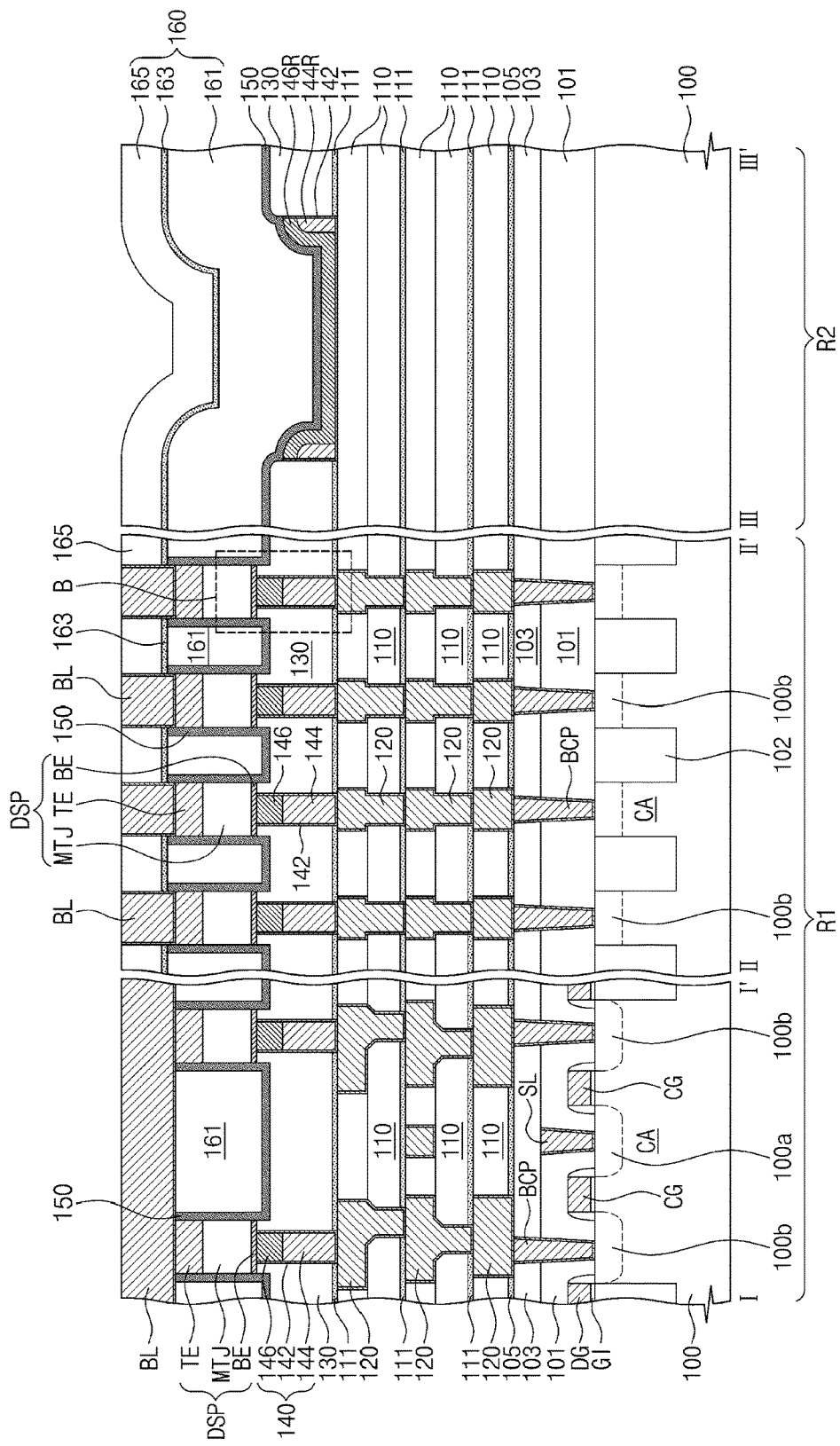
FIG. 13 is a sectional view illustrating a semiconductor memory device according to some example embodiments of the inventive concepts.
Figure 14A:
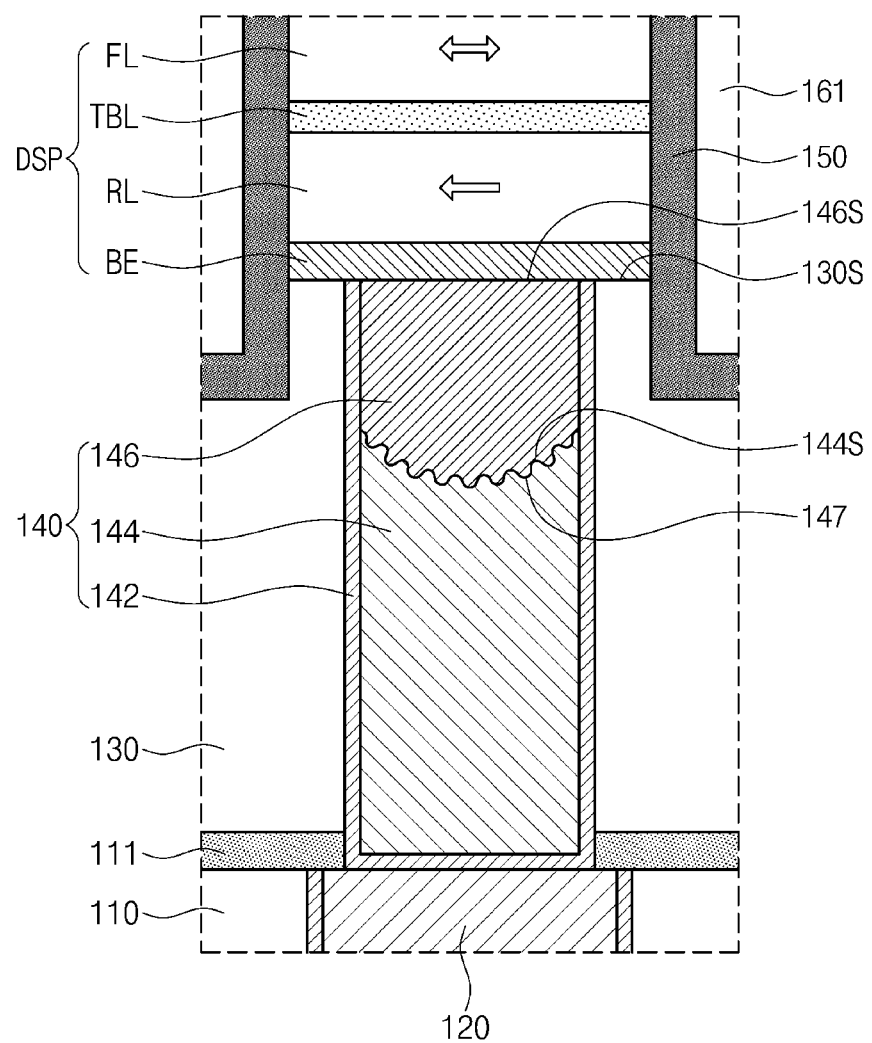
FIG. 14A and FIG. 14B are enlarged sectional views illustrating a portion 'B' of FIG. 13.
Figure 14B:
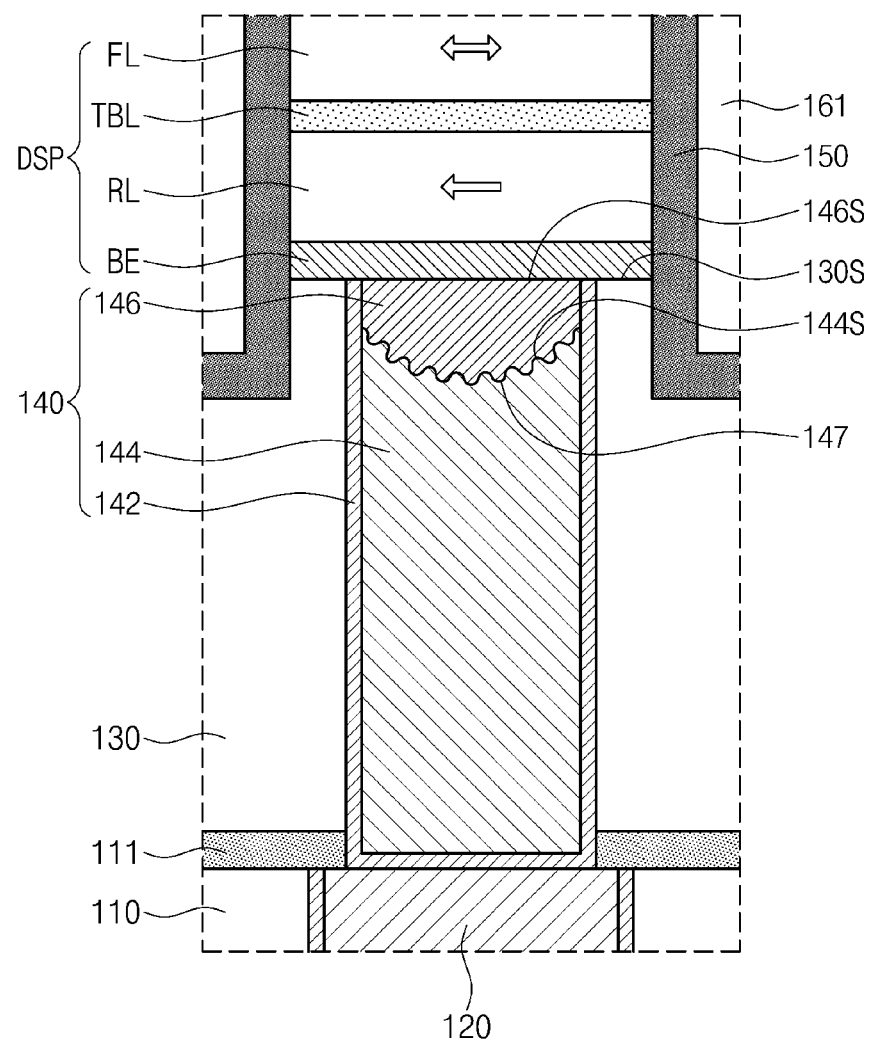

FIG. 13 is a sectional view illustrating a semiconductor memory device according to some example embodiments of the inventive concepts. FIG. 14A and FIG. 14B are enlarged sectional views illustrating a portion 'B' of FIG. 13. For concise description, an element previously described with reference to FIGS. 4 to 11 may be identified by a similar or identical reference number without repeating an overlapping description thereof.

Referring to FIGS. 13, 14A, and 14B, each of the data storage patterns DSP may have substantially the same width (e.g., a substantially common width) in the first direction D1 and the second direction D2. As used herein, a "substantially" common width means a common width within manufacturing tolerances and/or material tolerances. The width of the lower contact plug 140 may be smaller than a lower width of the data storage pattern DSP. For example, the width of the capping metal pattern 146 of the lower contact plug 140 may be smaller than the width of the bottom electrode BE of the data storage pattern DSP. Furthermore, the capping metal pattern 146 may be thicker than the bottom electrode BE. As shown in at least FIGS. 14A and 14B, a top surface 146s of the capping metal pattern may be coplanar or substantially coplanar (e.g., coplanar within manufacturing tolerances and/or material tolerances) with a top surface 130s of the upper insulating layer 130.

Referring to FIG. 14A, the uneven interface 147 between the metal pattern 144 and the capping metal pattern 146 (i.e., the top surface 144s of the metal pattern 144) may be positioned at a level lower than the bottom surface of the capping insulating layer 150. In some example embodiments, referring to FIG. 14B, the uneven interface between the metal pattern 144 and the capping metal pattern 146 may be positioned above the bottom surface of the capping insulating layer 150 (e.g., as shown in FIG. 14B, the interface 147 between the metal pattern 144 and the capping metal pattern 146 may be above a bottom surface of the capping insulating layer 150). As shown in FIG. 14, the interface 147 may be at a level that is lower than a level of a top surface 130s of the upper insulating layer 130.

A magnetic tunnel junction pattern according to some example embodiments of the inventive concepts will be described in more detail with reference to FIGS. 15 to 18. FIGS. 15 to 18 are diagrams schematically illustrating data storage patterns of semiconductor memory devices according to some example embodiments of the inventive concepts.

Figure 15:
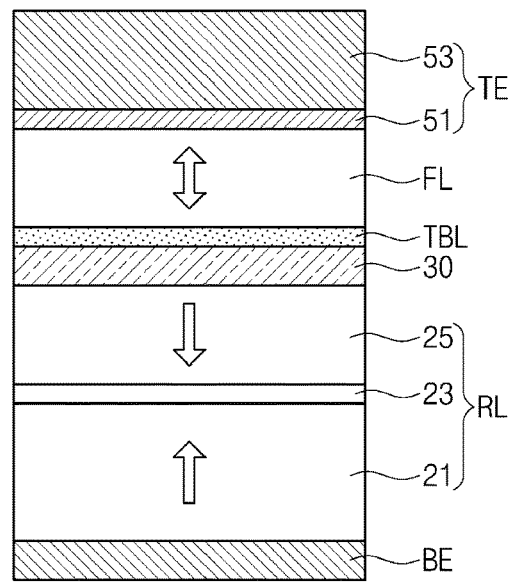
FIG. 15, FIG. 16, FIG. 17, and FIG. 18 are diagrams schematically illustrating data storage patterns of semiconductor memory devices according to some example embodiments of the inventive concepts.

In embodiments shown in FIG. 15, the data storage pattern DSP may include the bottom electrode BE, the top electrode TE, the reference and free magnetic layers RL and FL between the top and bottom electrodes TE and BE, and the tunnel barrier layer TBL between the reference and free magnetic layers RL and FL.

In some example embodiments, the reference magnetic layer RL may be configured to have a synthetic antiferromagnetic (SAF) structure. For example, the reference magnetic layer RL may include a first pinned pattern 21, a second pinned pattern 25, and an exchange coupling pattern 23 between the first and second pinned patterns 21 and 25.

The first pinned pattern 21 may be provided between the bottom electrode BE and the exchange coupling pattern 23. In other words, the first pinned pattern 21 may be provided adjacent to the bottom electrode BE. The first pinned pattern 21 may include a magnetic material and may have a magnetization direction that is fixed by the second pinned pattern 25. The first pinned pattern 21 may be anti-parallelly coupled to the second pinned pattern 25 by the exchange coupling pattern 23.

A polarization enhancement magnetic pattern 30 may be provided between the reference magnetic layer RL and the tunnel barrier layer TBL. The polarization enhancement magnetic pattern 30 may be in contact with the second pinned pattern 25 and the tunnel barrier layer TBL. The polarization enhancement magnetic pattern 30 may include a magnetic material, which is in contact with the tunnel barrier layer TBL and allows the magnetic tunnel junction pattern to have a high MR ratio. In addition, the polarization enhancement magnetic pattern 30 may include a magnetic material of inducing an interface perpendicular magnetic anisotropy at an interface between the tunnel barrier layer TBL and the polarization enhancement magnetic pattern 30.

The tunnel barrier layer TBL may have a thickness smaller than a spin diffusion distance. The tunnel barrier layer TBL may include an insulating material. The tunnel barrier layer TBL may be in contact with the free magnetic layer FL and may have a crystal structure similar to that of the free magnetic layer FL. In the case where the free magnetic layer FL has a body-centered cubic (BCC) structure, the tunnel barrier layer TBL may include an insulating material having a NaCl crystal structure. In the case where the tunnel barrier layer TBL and the free magnetic layer FL have lattice matched crystal structures at an interface therebetween, the magnetic tunnel junction pattern may have an improved tunnel magneto resistance (TMR) ratio.

The tunnel barrier layer TBL may be formed of or include at least one of magnesium oxide, titanium oxide, aluminum oxide, magnesium-zinc oxide, or magnesium-boron oxide.

The free magnetic layer FL may be provided on the tunnel barrier layer TBL. The free magnetic layer FL may include a magnetic material, which is in contact with the tunnel barrier layer TBL and allows the magnetic tunnel junction pattern to have a high TMR ratio. The free magnetic layer FL may include a magnetic material, whose magnetization direction can be changed. The free magnetic layer FL may have a magnetization direction, which is parallel or perpendicular to the interface between the tunnel barrier layer TBL and the free magnetic layer FL.

The top electrode TE may be thicker than the bottom electrode BE and may include a metal-compound pattern 51 and a metal pattern 53, which are sequentially stacked. The metal-compound pattern 51 may be formed of or include at least one of metal nitrides (e.g., titanium nitride or tantalum nitride) or metal oxides (e.g., tantalum oxide). The metal pattern 53 may be formed of or include at least one of copper, tungsten, titanium, tantalum, ruthenium, or platinum.

Figure 16:
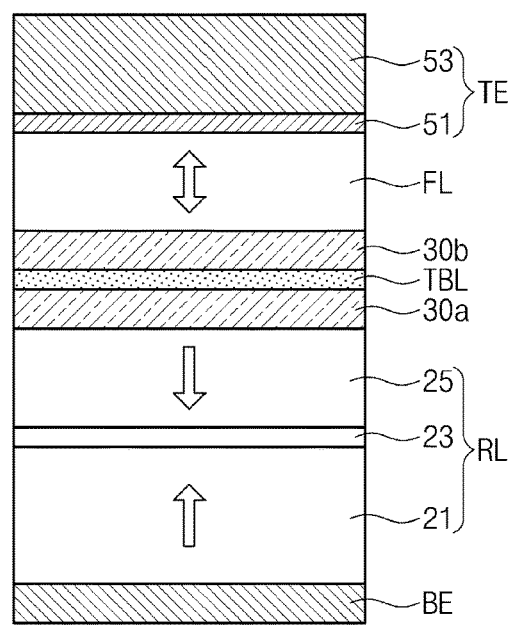

In some example embodiments, as shown in FIG. 16, the data storage pattern DSP may include the bottom and top electrodes BE and TE, the reference and free magnetic layers RL and FL between the bottom and top electrodes BE and TE, and the tunnel barrier layer TBL between the reference and free magnetic layers RL and FL, similar to that described with reference to FIG. 15. Here, the reference magnetic layer RL may be provided to have an SAF structure including the first pinned pattern 21, the second pinned pattern 25, and the exchange coupling pattern 23 therebetween. The data storage pattern DSP may include a first polarization enhancement magnetic pattern 30a, which is provided between the tunnel barrier layer TBL and the reference magnetic layer RL, and a second polarization enhancement magnetic pattern 30b, which is provided between the tunnel barrier layer TBL and the free magnetic layer FL. The first polarization enhancement magnetic pattern 30a may be provided to be in contact with a bottom surface of the tunnel barrier layer TBL, and the second polarization enhancement magnetic pattern 30b may be provided to be in contact with a top surface of the tunnel barrier layer TBL. The first and second polarization enhancement magnetic patterns 30a and 30b may have a crystal structure similar to that of the tunnel barrier layer TBL. For example, the first and second polarization enhancement magnetic patterns 30a and 30b may include a body centered cubic (BCC) magnetic material or a BCC magnetic material containing a non-magnetic element. For example, the first and second polarization enhancement magnetic patterns 30a and 30b may include CoFe or NiFe and, in some example embodiments, they may include CoFe or NiFe that is doped with boron (B). As an example, the first and second polarization enhancement magnetic patterns 30a and 30b may include cobalt-iron-boron (CoFeB).

Figure 17:
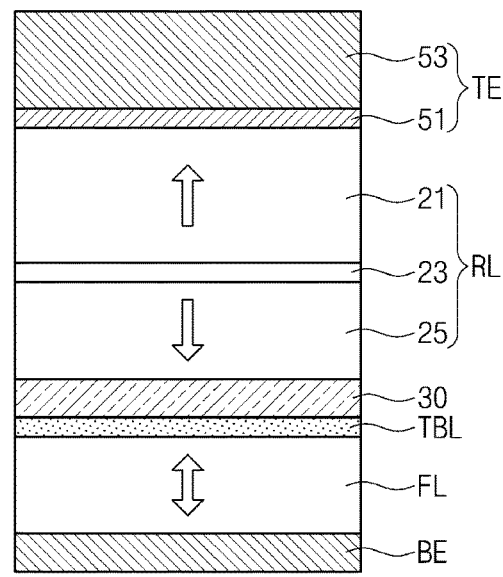

In some example embodiments, as shown in FIG. 17, the free magnetic layer FL may be provided between the bottom electrode BE and the tunnel barrier layer TBL, and the reference magnetic layer RL may be provided between the top electrode TE and the tunnel barrier layer TBL.

Figure 18:
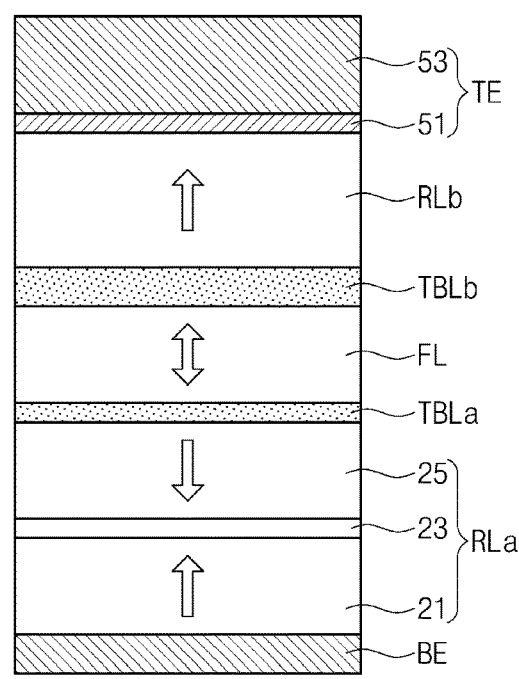

In some example embodiments, as shown in FIG. 18, the data storage pattern DSP may include first and second reference magnetic layers RLa and RLb, a free magnetic layer FL, and first and second tunnel barrier layers TBLa and TBLb, which are provided between the bottom electrode BE and the top electrode TE.

The first reference magnetic layer RLa may be provided between the bottom electrode BE and the first tunnel barrier layer TB La, and the second reference magnetic layer RLb may be provided between the top electrode TE and the second tunnel barrier layer TBLb. In some example embodiments, the first reference magnetic layer RLa may be provided to have an SAF structure including the first pinned pattern 21, the second pinned pattern 25, and the exchange coupling pattern 23 therebetween. The second reference magnetic layer RLb may be formed of a magnetic material having a fixed magnetization direction.

The free magnetic layer FL may be provided between the first and second tunnel barrier layers TBLa and TBLb. Here, the first and second tunnel barrier layers TBLa and TBLb may have different thicknesses.

In the embodiments shown in FIG. 18, the first reference magnetic layer RLa, the first tunnel barrier layer TB La, and the free magnetic layer FL may constitute a first magnetic tunnel junction, whereas the second reference magnetic layer RLb, the second tunnel barrier layer TBLb, and the free magnetic layer FL may constitute a second magnetic tunnel junction.

In a method of fabricating a semiconductor memory device according to some example embodiments of the inventive concepts, it may be possible to suppress or prevent a height difference between a bottom surface of an alignment trench formed on a second region and a top surface of an upper insulating layer from being reduced, when lower contact plugs are formed on a first region for a memory cell array. Accordingly, in subsequent patterning processes to be performed after the formation of the lower contact plugs, it may be possible to perform a photolithography process with improved reliability.

In addition, since a magnetic tunnel junction pattern is provided on a capping metal pattern with reduced surface roughness and improved flatness, it may be possible to improve electric characteristics and reliability of a magnetic tunnel junction pattern.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor memory device, comprising:
a selection transistor on a semiconductor substrate;
an upper insulating layer covering the selection transistor, the upper insulating layer having a first top surface and a second top surface that is at a lower level than the first top surface of the upper insulating layer;
a lower contact plug coupled to a drain region of the selection transistor and configured to penetrate the upper insulating layer, the lower contact plug including a metal pattern and a capping metal pattern in contact with a top surface of the metal pattern, wherein a top surface of the capping metal pattern is coplanar with the first top surface of the upper insulating layer, the top surface of the metal pattern having a first surface roughness, the top surface of the capping metal pattern having a second surface roughness, the second surface roughness smaller than the first surface roughness; and
a magnetic tunnel junction pattern coupled to the lower contact plug, the magnetic tunnel junction pattern including a bottom electrode, a top electrode, a lower magnetic layer and an upper magnetic layer between the top electrode and the bottom electrode, and a tunnel barrier layer between the lower magnetic layer and the upper magnetic layer,
wherein a width of the capping metal pattern is smaller than a width of the bottom electrode of the magnetic tunnel junction pattern, and
wherein a side surface of the capping metal pattern is aligned with a side surface of the metal pattern.

2. The semiconductor memory device of claim 1, wherein the top surface of the capping metal pattern is in direct contact with the bottom electrode of the magnetic tunnel junction pattern.

3. The semiconductor memory device of claim 1, wherein the top surface of the metal pattern is isolated from direct contact with the magnetic tunnel junction pattern.

4. The semiconductor memory device of claim 1, wherein
the metal pattern includes a first metallic material, and
the capping metal pattern includes a second metallic material, the second metallic material different from the first metallic material.

5. The semiconductor memory device of claim 4, wherein
the first metallic material includes tungsten, and
the second metallic material includes titanium nitride.

6. The semiconductor memory device of claim 1, wherein the capping metal pattern and the bottom electrode include a common metallic material.

7. The semiconductor memory device of claim 1, wherein a height of a center portion of the metal pattern is smaller than a height of an edge portion of the metal pattern.

8. The semiconductor memory device of claim 1, wherein
the lower contact plug further includes a barrier metal pattern, the barrier metal pattern covering the side surface of the capping metal pattern, the side surface of the metal pattern, and a bottom surface of the metal pattern,
the barrier metal pattern has a first thickness on the side surface of the metal pattern, and
the capping metal pattern has a second thickness on the top surface of the metal pattern, the second thickness greater than the first thickness.

9. The semiconductor memory device of claim 8, wherein the capping metal pattern and the barrier metal pattern include a common material.

10. The semiconductor memory device of claim 1, further comprising:
a capping insulating layer on the upper insulating layer, the capping insulating layer covering a side surface of the magnetic tunnel junction pattern,
wherein an interface between the metal pattern and the capping metal pattern is at a level lower than a level of a bottom surface of the capping insulating layer.

11. The semiconductor memory device of claim 1, further comprising:
a capping insulating layer on the upper insulating layer, the capping insulating layer covering a side surface of the magnetic tunnel junction pattern,
wherein an interface between the metal pattern and the capping metal pattern is above a bottom surface of the capping insulating layer.

12. A semiconductor memory device, comprising:
a lower contact plug on a semiconductor substrate, the lower contact plug penetrating an upper insulating layer having a first top surface and a second top surface that is at a lower level than the first top surface of the upper insulating layer, the lower contact plug including,
a metal pattern penetrating a lower portion of the upper insulating layer, the metal pattern including a first metallic material, the metal pattern having a top surface that is downwardly curved, and
a capping metal pattern in direct contact with the metal pattern and penetrating the upper insulating layer, the capping metal pattern including a second metallic material, the second metallic material different from the first metallic material, the capping metal pattern having a top surface that is flat, wherein the top surface of the capping metal pattern is coplanar with the first top surface of the upper insulating layer; and
a magnetic tunnel junction pattern including a sequential stack of a bottom electrode, a lower magnetic layer, a tunnel barrier layer, an upper magnetic layer, and a top electrode on the semiconductor substrate, the bottom electrode in direct contact with the top surface of the capping metal pattern of the lower contact plug,
wherein a width of the capping metal pattern is smaller than a width of the bottom electrode of the magnetic tunnel junction pattern, and
wherein a side surface of the capping metal pattern is aligned with a side surface of the metal pattern.

13. The semiconductor memory device of claim 12, wherein
the top surface of the metal pattern has a first surface roughness, and
the top surface of the capping metal pattern has a second surface roughness, the second surface roughness smaller than the first surface roughness.

14. The semiconductor memory device of claim 12, wherein an interface between the metal pattern and the capping metal pattern is at a level that is lower than a level of the first top surface of the upper insulating layer.

15. The semiconductor memory device of claim 12, wherein a height of a center portion of the metal pattern is smaller than a height of an edge portion of the metal pattern.

16. The semiconductor memory device of claim 12, wherein the lower contact plug further includes a barrier metal pattern, the barrier metal pattern covering the side surface of the metal pattern, a bottom surface of the metal pattern, and the side surface of the capping metal pattern.

17. The semiconductor memory device of claim 16, wherein
the barrier metal pattern has a first thickness on the side surface of the metal pattern, and
the capping metal pattern has a second thickness on the top surface of the metal pattern, the second thickness greater than the first thickness.

18. The semiconductor memory device of claim 12, wherein
the first metallic material includes tungsten, and
the second metallic material includes titanium nitride.

19. A semiconductor memory device, comprising:
a lower contact plug on a semiconductor substrate, the lower contact plug penetrating an interlayered insulating layer, the lower contact plug including,
a metal pattern penetrating a lower portion of the interlayered insulating layer, the metal pattern including a first metallic material, the metal pattern having a downwardly curved top surface, and
a capping metal pattern in direct contact with the metal pattern and penetrating an upper portion of the interlayered insulating layer, the capping metal pattern including a second metallic material, the second metallic material different from the first metallic material, the capping metal pattern having a flat top surface;
a barrier metal pattern covering a side surface of the capping metal pattern, a side surface of the metal pattern, and a bottom surface of the metal pattern; and
a magnetic tunnel junction pattern including a sequential stack of a bottom electrode, a lower magnetic layer, a tunnel barrier layer, an upper magnetic layer, and a top electrode on the semiconductor substrate,
wherein the bottom electrode of the magnetic tunnel junction pattern is in direct contact with a top surface of the capping metal pattern and a top surface of the barrier metal pattern, wherein a width of the capping metal pattern is smaller than a width of the bottom electrode of the magnetic tunnel junction pattern, and wherein the side surface of the capping metal pattern is aligned with the side surface of the metal pattern.

\* \* \* \* \*